United States Patent
Collins et al.

(10) Patent No.: US 10,510,515 B2
(45) Date of Patent: Dec. 17, 2019

(54) PROCESSING TOOL WITH ELECTRICALLY SWITCHED ELECTRODE ASSEMBLY

(71) Applicant: Applied Materials, Inc., Santa Clara, CA (US)

(72) Inventors: Kenneth S. Collins, San Jose, CA (US); Kartik Ramaswamy, San Jose, CA (US); Shahid Rauf, Pleasanton, CA (US); Kallol Bera, San Jose, CA (US); James D. Carducci, Sunnyvale, CA (US); Michael R. Rice, Pleasanton, CA (US); Yue Guo, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/015,074

(22) Filed: Jun. 21, 2018

(65) Prior Publication Data

US 2018/0374684 A1    Dec. 27, 2018

Related U.S. Application Data

(60) Provisional application No. 62/523,768, filed on Jun. 22, 2017.

(51) Int. Cl.
  *H01J 37/32* (2006.01)
  *H01L 21/02* (2006.01)
  (Continued)

(52) U.S. Cl.
  CPC .... *H01J 37/32568* (2013.01); *C23C 16/4584* (2013.01); *C23C 16/4586* (2013.01);
  (Continued)

(58) Field of Classification Search
  CPC .......... H01J 37/321; H01J 27/16; H01J 37/08; H01J 37/3171; H01J 37/32183;
  (Continued)

(56) References Cited

U.S. PATENT DOCUMENTS

| | | |
|---|---|---|
| 4,765,179 A | 8/1988 | Fuller et al. |
| 4,825,467 A | 4/1989 | Rist et al. |
| | (Continued) | |

FOREIGN PATENT DOCUMENTS

| | | |
|---|---|---|
| CN | 102548177 | 7/2012 |
| JP | 06-061153 | 3/1994 |
| JP | 2013-097958 | 5/2013 |

OTHER PUBLICATIONS

Muegge, Microwave Plasma Processing, 2013, 12 pages.
(Continued)

*Primary Examiner* — Tung X Le
*Assistant Examiner* — Borna Alaeddini
(74) *Attorney, Agent, or Firm* — Fish & Richardson P.C.

(57) ABSTRACT

A plasma reactor includes a chamber body having an interior space that provides a plasma chamber, a gas distributor, a pump coupled to the plasma chamber, a workpiece support to hold a workpiece, an intra-chamber electrode assembly comprising a plurality of filaments extending laterally through the plasma chamber, each filament including a conductor surrounded by a cylindrical insulating shell, the plurality of filaments including a first multiplicity of filaments and a second multiplicity of filaments arranged in an alternating pattern with the first multiplicity of filaments, a first bus coupled to the first multiplicity of filaments and a second bus coupled to the second multiplicity of filaments, an RF power source to apply RF signal the intra-chamber electrode assembly, and at least one RF switch configured to controllably electrically couple and decouple the first bus from one of i) ground, ii) the RF power source, or iii) the second bus.

20 Claims, 16 Drawing Sheets

(51) Int. Cl.
  *C23C 16/455* (2006.01)
  *C23C 16/458* (2006.01)
  *C23C 16/509* (2006.01)

(52) U.S. Cl.
  CPC .. *C23C 16/45519* (2013.01); *C23C 16/45536* (2013.01); *C23C 16/45551* (2013.01); *C23C 16/45578* (2013.01); *C23C 16/509* (2013.01); *H01J 37/3244* (2013.01); *H01J 37/32082* (2013.01); *H01J 37/32715* (2013.01); *H01J 37/32834* (2013.01); *H01L 21/0228* (2013.01); *H01L 21/02274* (2013.01); *H01J 2237/3323* (2013.01)

(58) Field of Classification Search
  CPC ........... H01J 37/32477; H01J 2237/022; H01J 2237/0266; H01J 2237/061; H01J 2237/065; H01J 37/32412
  See application file for complete search history.

(56) References Cited

U.S. PATENT DOCUMENTS

| | | | |
|---|---|---|---|
| 4,903,297 | A | 2/1990 | Rist et al. |
| 5,522,934 | A | 6/1996 | Suzuki et al. |
| 6,161,499 | A | 12/2000 | Sun et al. |
| 6,164,241 | A | 12/2000 | Chen et al. |
| 6,237,526 | B1 * | 5/2001 | Brcka ................... H01J 37/321 118/723 AN |
| 6,313,430 | B1 | 11/2001 | Fujioka et al. |
| 6,353,201 | B1 | 3/2002 | Yamakoshi et al. |
| 6,444,085 | B1 | 9/2002 | Collins et al. |
| 6,456,010 | B2 | 9/2002 | Yamakoshi et al. |
| 6,503,816 | B2 | 1/2003 | Ito et al. |
| 7,001,831 | B2 | 2/2006 | Niira et al. |
| 7,205,034 | B2 | 4/2007 | Kawamura et al. |
| 7,833,587 | B2 | 11/2010 | Mashima et al. |
| 7,868,517 | B2 | 1/2011 | Belot et al. |
| 8,081,049 | B2 | 12/2011 | Yoshida |
| 8,129,912 | B2 | 3/2012 | Ko et al. |
| 8,436,318 | B2 * | 5/2013 | Sinclair ................... H01J 27/16 250/423 R |
| 8,607,733 | B2 | 12/2013 | Tachibana |
| 8,914,166 | B2 | 12/2014 | He |
| 9,165,748 | B2 | 10/2015 | Takagi et al. |
| 9,355,821 | B2 | 5/2016 | Chen et al. |
| 9,396,900 | B2 | 6/2016 | Lane et al. |
| 9,419,583 | B2 | 8/2016 | Rinaldi et al. |
| 9,431,217 | B2 | 8/2016 | Mai et al. |
| 9,554,738 | B1 | 1/2017 | Gulati et al. |
| 2004/0060662 | A1 | 4/2004 | Yeom et al. |
| 2005/0067934 | A1 | 3/2005 | Ueda et al. |
| 2006/0138957 | A1 | 6/2006 | Fujioka et al. |
| 2007/0012250 | A1 | 1/2007 | Yeom et al. |
| 2007/0068455 | A1 | 3/2007 | Bolden, II |
| 2010/0239757 | A1 | 9/2010 | Murata |
| 2012/0247390 | A1 | 10/2012 | Sawada et al. |
| 2013/0105086 | A1 | 5/2013 | Banna et al. |
| 2018/0308661 | A1 | 10/2018 | Collins et al. |
| 2018/0308666 | A1 | 10/2018 | Collins et al. |

OTHER PUBLICATIONS

Anders, "Plasma and Ion Sources in Large Area Coatings: A Review," The International Conference on Metallurgical Coatings and Thin Films (ICMCTF), Feb. 2005, 42 pages.
Chang et al., "Generating large-area uniform microwave field for plasma excitation," Physics of Plasmas, 2012, 19, 6 pages.
Chen et al., "Generation of uniform large-area very high frequency plasmas by launching two specific standing waves simultaneously," Journal of Applied Physics, 2014, 116, 9 pages.
Chen et al., "Generation of Uniform Large-Area VHF Plasmas by Launching a Traveling Wave," Plasma Processes and Polymers, Jan. 2014, 11(1): 7-11.
Cober Electronics, Inc., "Plasmaline Large Area Plasma Systems," Stan Whitehair, 21 pages.
Goya et al., "Development of Amorphous Silicon/Microcrystalline Silicon Tandem Solar Cells," 3$^{rd}$ World Conference on Photovoltaic Energy Conversion, Osaka, Japan, May 11-18, 2003, 1570-1573.
He and Hall, "Longitudinal voltage distribution in transverse if discharge waveguide lasers," J. Appl. Phys., Aug. 1983, 54(8): 4367-4373.
Hollenstein et al., "Resonant RF network antennas for large-area and large-volume inductively coupled plasma sources," Plasma Sources Sci. Technol., 2013, 22: 1-10.
Hwang et al., "Dual comb-type electrodes as a plasma source for very high frequency plasma enhanced chemical vapor deposition," Thin Solid Films, 2010, 518: 2124-2127.
Ito et al., "Large Area Deposition of Hydrogenated Amorphous Silicon by VHF-PECVD Using Novel Electrodes," IEEE, 900-903.
Livesay, "Large-area electron-beam source," J. Vac. Sci. Technol., Nov. 1993, 11(6): 2304-2308.
Mashima et al., "Characteristics of Very High Frequency Plasma Produced Using a Ladder-Shaped Electrode," Jpn. J. Appl. Phys., 1999, 38: 4305-4308.
Mashima et al., "Large area VHF plasma production using a ladder-shaped electrode," Thin Solid Films, 2006, 512-516.
Meiling et al., "Film Uniformity and Substrate-To-Electrode Attachment in Large-Area VHF Glow-Discharge Deposition of a-Si:H," 25$^{th}$ PVSC, May 1996, 1153-1156.
Morrison et al., "Deposition of Microcrystalline Silicon Films and Solar Cells via the Pulsed PECVD Technique," IEEE, 1102-1105.
Noda et al., "Large Area Thin Film Si Tandem Module Production Using VHF Plasma with a Ladder-Shaped Electrode," 3$^{rd}$ World Conference on Photovoltaic Energy Conversion, May 11-18, 2003, Osaka, Japan, 1849-1851.
Satake et al., "Experimental and numerical studies on voltage distribution in capacitively coupled very high-frequency plasmas," Plasma Sources Sci. Technol., 2004, 13: 436-445.
Sato et al., "Design of Folded Monopole Array Antenna Used for Large Area Plasma Production," IEEE, 2004, 1026-1029.
Schmidt et al., "Improving plasma uniformity using lens-shaped electrodes in a large area very high frequency reactor," Journal of Applied Physics, May 2004, 95(9): 4559-4564.
Schmidt, "Characterization of a High-Density, Large-Area VHF Plasma Source," Characterization of a High-Density, Large-Area VHF Plasma Source, 2006, 154 pages.
Stephan and Kuske, "Large Area Deposition Technique for PECVD of Amorphous Silicon," IEEE, 1997, 647-650.
Takagi et al., "Large Area Multi-Zone Type VHF-PCVD System for a-Si and μ-Si Deposition," 3$^{rd}$ World Conference on Photovoltaic Energy Conversion, May 11-18, 2003, Osaka, Japan, 1792-1795.
Terasa et al., "PECVD of Doped and Intrinsic A-SI:H Layers for Solar Cell Structures Using a (Novel) Inline Deposition System," IEEE, 1528-1531.
Wu et al., "A traveling wave-driven, inductively coupled large area plasma source," Applied Physics Letters, Feb. 1998, 72(7): 777-779.
Wu et al., "The influence of antenna configuration and standing wave effects on density profile in a large-area inductive plasma source," Plasma Sources Sci. Technol., 2000, 9: 210-218.
Yamauchi et al., "Development of a-Si/Micro-crystalline-Si Tandem-type Photovoltaic Solar Cell," Technical Review, Oct. 2005, 42(3): 1-5.
Yamauchi et al., "High Efficiency Large Area Solar Module in Mitsubishi Heavy Industries," Technical Review, Oct. 2004, 41(5): 1-4.
Yu et al., "Linear Plasma Sources for Large Area Film Deposition: A Brief Review," Plasma Science and Technology, Apr. 2014, 16(4): 356-362.

* cited by examiner

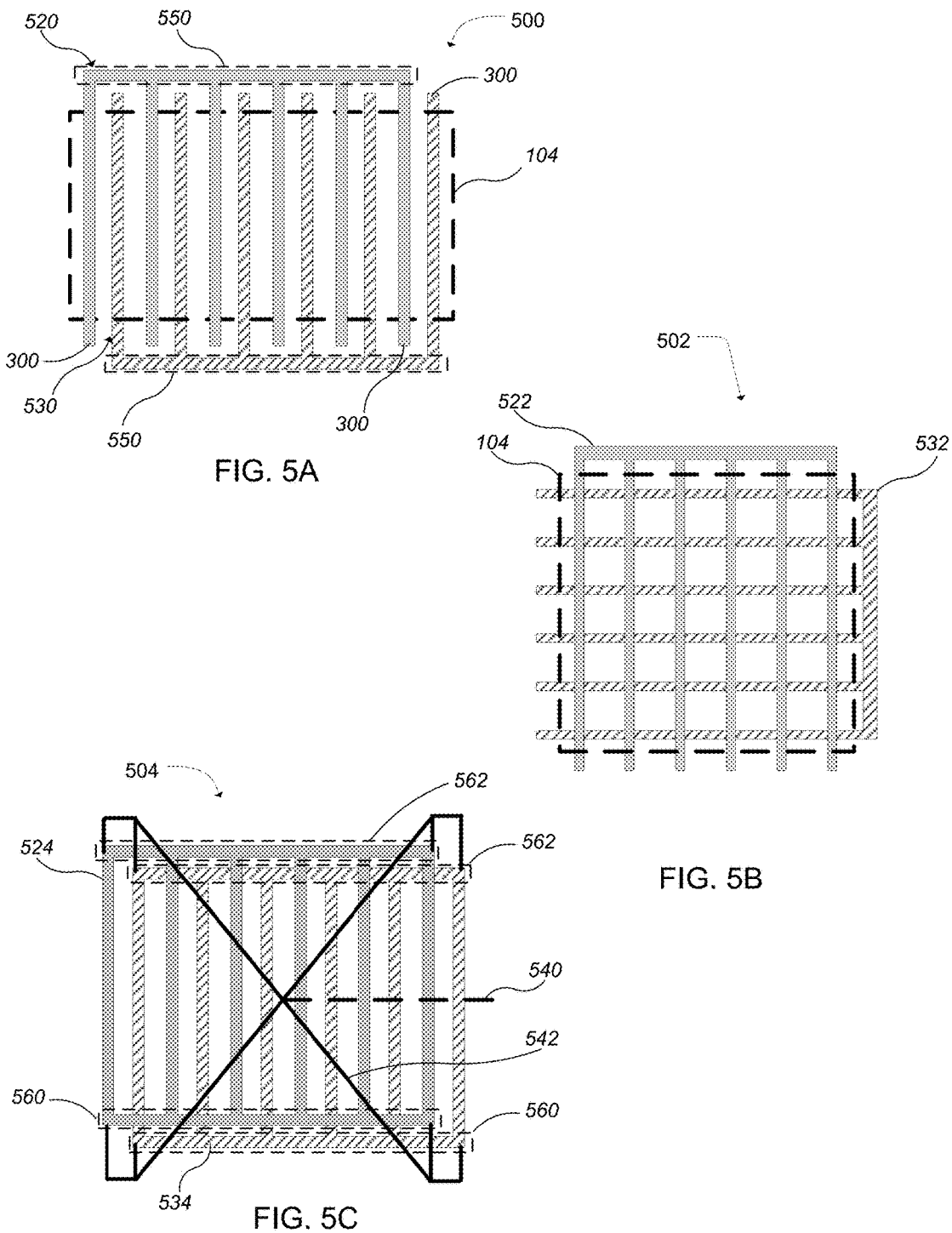

PROCESSING TOOL WITH ELECTRICALLY SWITCHED ELECTRODE ASSEMBLY

CROSS-REFERENCE TO RELATED APPLICATIONS

This application claims priority to U.S. Provisional Patent Application Ser. No. 62/523,768, filed on Jun. 22, 2017, the disclosure of which is incorporated by reference.

TECHNICAL FIELD

The present disclosure relates to a processing tool, e.g. for depositing a film on, etching, or treating a workpiece such as a semiconductor wafer.

BACKGROUND

Plasma is typically generated using a capacitively-coupled plasma (CCP) source or an inductively-coupled plasma (ICP) source. A basic CCP source contains two metal electrodes separated by a small distance in a gaseous environment similar to a parallel plate capacitor. One of the two metal electrodes are driven by a radio frequency (RF) power supply at a fixed frequency while the other electrode is connected to an RF ground, generating an RF electric field between the two electrodes. The generated electric field ionizes the gas atoms, releasing electrons. The electrons in the gas are accelerated by the RF electric field and ionizes the gas directly or indirectly by collisions, producing plasma.

A basic ICP source typically contains a conductor in a spiral or a coil shape. When an RF electric current is flowed through the conductor, RF magnetic field is formed around the conductor. The RF magnetic field accompanies an RF electric field, which ionizes the gas atoms and produces plasma.

Plasmas of various process gasses are widely used in fabrication of integrated circuits. Plasmas can be used, for example, in thin film deposition, etching, and surface treatment.

Atomic layer deposition (ALD) is a thin film deposition technique based on the sequential use of a gas phase chemical process. Some ALD processes use plasmas to provide necessary activation energy for chemical reactions. Plasma-enhanced ALD processes can be performed at a lower temperature than non-plasma-enhanced (e.g., 'thermal') ALD processes.

SUMMARY

In one aspect, a plasma reactor includes a chamber body having an interior space that provides a plasma chamber, a gas distributor to deliver a processing gas to the plasma chamber, a pump coupled to the plasma chamber to evacuate the chamber, a workpiece support to hold a workpiece, an intra-chamber electrode assembly comprising a plurality of filaments extending laterally through the plasma chamber between a ceiling of the plasma chamber and the workpiece support, each filament including a conductor surrounded by a cylindrical insulating shell, wherein the plurality of filaments includes a first multiplicity of filaments and a second multiplicity of filaments arranged in an alternating pattern with the first multiplicity of filaments, a first bus coupled to the first multiplicity of filaments and a second bus coupled to the second multiplicity of filaments, an RF power source to apply an RF signal the intra-chamber electrode assembly, and at least one RF switch configured to controllably electrically couple and decouple the first bus from one of i) ground, ii) the RF power source, or iii) the second bus.

Implementations may include one or more of the following features.

The at least one RF switch may include a plurality of RF switches connected in parallel between the first bus and the one of the one of i) ground, ii) the RF power source, or iii) the second bus.

The at least one RF switch may be configured to controllably electrically couple and decouple the first bus from the second bus. The at least one RF switch may include a plurality of switches connected in parallel between different pairs of locations on the first bus and the second bus to controllably electrically couple and decouple the first bus from the second bus.

The at least one RF switch may include a first switch configured to controllably electrically couple and decouple the first bus from ground, and include at least one second RF switch configured to controllably electrically couple and decouple the second bus from ground. The at least one RF switch may include a first plurality of switches connected in parallel between different locations on the first bus and ground, and the at least one second switch may include a second plurality of switches connected in parallel between different locations on the second bus and ground. The different locations on the first bus may include opposing ends of the first bus and the different locations on the second bus may include opposing ends of the second bus.

The at least one RF switch may include a first plurality of switches connected in parallel between different locations on the first bus and the RF power source, and the at least one second switch may include a second plurality of switches connected in parallel between different locations on the second bus and the RF power source. The different locations on the first bus may include opposing ends of the first bus and the different locations on the second bus may include opposing ends of the second bus. The at least one RF switch may include a first plurality of switches connected in parallel between different locations on the first bus and the RF power source, and the at least one second switch may include a second plurality of switches connected in parallel between different locations on the second bus and ground. The different locations on the first bus may include opposing ends of the first bus and the different locations on the second bus may include opposing ends of the second bus.

The at least one RF switch includes a first switch configured to controllably electrically couple and decouple the first bus from the RF power source, and includes at least one second switch configured to controllably electrically couple and decouple the second bus from the RF power source.

Some implementation may include a third bus coupled to the first multiplicity of filaments, and a fourth bus coupled to the second multiplicity of filaments, wherein the plurality of filaments have a plurality of first ends and a plurality of second ends and a first end of each respective filament is closer to a first sidewall of the plasma chamber than a second end of the respective filament, and wherein the first bus is coupled to the first ends of the first multiplicity of filaments, the second bus is coupled to the first ends of the second multiplicity of filaments, the third bus is coupled to the second ends of the first multiplicity of filaments, and the fourth bus is coupled to the second ends of the second multiplicity of filaments.

The at least one RF switch may be configured to controllably electrically couple and decouple the first bus from the second bus, and may include at least one second RF switch configured to controllably electrically couple and decouple the third bus from the fourth bus.

The at least one RF switch may include a first switch configured to controllably electrically couple and decouple the first bus from ground, and may include at least one second RF switch configured to controllably electrically couple and decouple the third bus from ground.

The RF source may be coupled by a first tap to the fourth bus and by a second tap to the second bus.

Some implementation may include at least one third RF switch configured to controllably electrically couple and decouple the third bus from ground, and include at least one fourth RF switch configured to controllably electrically couple and decouple the fourth bus from ground. The at least one RF switch may include a first switch configured to controllably electrically couple and decouple the first bus from ground, and include at least one second RF switch configured to controllably electrically couple and decouple the second bus from the RF source, at least one third RF switch configured to controllably electrically couple and decouple the third bus from ground, and include at least one fourth RF switch configured to controllably electrically couple and decouple the fourth bus from the RF source.

The at least one RF switch includes a first switch configured to controllably electrically couple and decouple the first bus from the RF source, and include at least one second RF switch configured to controllably electrically couple and decouple the second bus from the RF source, at least one third RF switch configured to controllably electrically couple and decouple the third bus from the RF source, and include at least one fourth RF switch configured to controllably electrically couple and decouple the fourth bus from the RF source.

In another aspect, a plasma reactor includes a chamber body having an interior space that provides a plasma chamber, a gas distributor to deliver a processing gas to the plasma chamber, a pump coupled to the plasma chamber to evacuate the chamber, a workpiece support to hold a workpiece, an intra-chamber electrode assembly comprising a plurality of filaments extending laterally through the plasma chamber between a ceiling of the plasma chamber and the workpiece support, each filament including a conductor surrounded by a cylindrical insulating shell, a bus outside the chamber and coupled to opposing ends of plurality of filaments, an RF power source to apply an RF signal the intra-chamber electrode assembly, and a plurality of RF switch configured to controllably electrically couple and decouple a plurality of different locations on bus from one of i) ground or ii) the RF power source.

Certain implementations may have one or more of the following advantages. Plasma uniformity may be improved. Plasma process repeatability may be improved. Metal contamination may be reduced. Particle generation may be reduced. Plasma charging damage may be reduced. Uniformity of plasma may be maintained over different process operating conditions. Plasma power coupling efficiency may be improved. Plasma region size may be reduced for a given size of a workpiece. Plasma process throughput may be improved. Effects of local non-uniformity of the plasma region may be reduced through switching, and thus within-wafer uniformity may be improved. A grounded top electrode integrated with a gas distributing showerhead may be implemented for introducing gas in a uniform manner without undesirable gas breakdown in showerhead holes.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIGS. 5A-C are schematic top view diagrams of various examples of intra-chamber electrode assembly configurations.

Like reference symbols in the various drawings indicate like elements.

DETAILED DESCRIPTION

Figure 1:
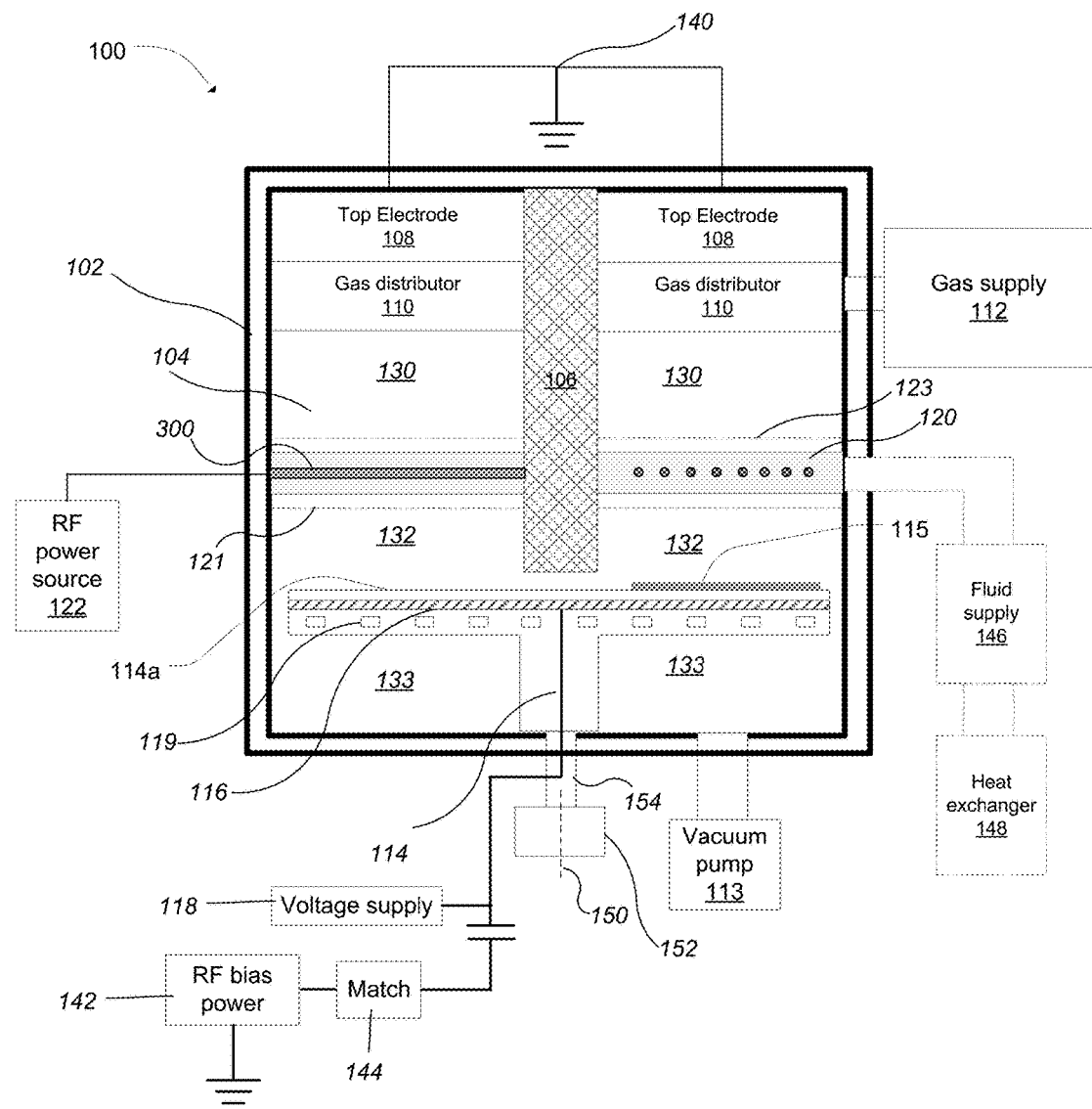
FIG. 1 is a schematic side view diagram of an example of a processing tool.

In a conventional plasma reactor, a workpiece remains stationary within the reactor chamber. A plasma region is generated above the stationary workpiece, which then treats the workpiece surface. However, some plasma processing applications can benefit from having the workpiece move through a plasma region, i.e., a relative motion between the plasma region and the workpiece. In addition, for some tools the substrate is moved between different chambers for a sequence of processing steps.

One way of achieving relative motion between the workpiece and the plasma region is by placing the workpiece on a workpiece support that moves along a linear path, e.g., a conveyor belt. In such a configuration, the workpiece may make a single pass in one direction through the plasma region and exit the other side of the chamber. This may be advantageous for some sequential processes in which workpiece travels through multiple chambers of different types as part of a fabrication process.

Another way of achieving relative motion between the workpiece and the plasma region is by placing the workpiece on a rotating workpiece support. Rotating workpiece support enables multiple passes through the plasma region without changing the direction of travel, which can improve throughput as the workpiece support does not need to continuously change its direction of travel. However, if the support is rotating, then different regions of the workpiece may be moving at different velocities relative to the region plasma.

Plasma uniformity in a conventional CCP source is typically determined by electrode(s) size and inter-electrode distance, as well as by gas pressure, gas composition, and applied RF power. At higher radio frequencies, additional effects may become significant or even dominate non-uniformities due to the presence of standing waves or skin effects. Such additional effects becomes more pronounced at higher frequencies and plasma densities.

Plasma uniformity in a conventional ICP source is typically determined by the configuration of ICP coil(s) including its size, geometry, distance to workpiece, and associated RF window location, as well as by gas pressure, gas composition, and power. In case of multiple coils or coil segments, the current or power distribution and their relative phase, if driven at same frequency, might also be a significant factor. Power deposition tends to occur within several centimeters under or adjacent to ICP coils due to skin effect, and such localized power deposition typically leads to process non-uniformities that reflect the coil geometries. Such plasma non-uniformity causes a potential difference across a workpiece, which can also lead to plasma charging damage (e.g., transistor gate dielectric rupture).

A large diffusion distance is typically needed for improved uniformity of ICP source. However, a conventional ICP source with a thick RF window is typically inefficient at high gas pressures due to low power coupling, which leads to high drive current resulting in high resistive power losses. In contrast, an intra-chamber electrode assembly does not need to have an RF window, but only a cylindrical shell. This can provide better power coupling and better efficiency.

In a plasma chamber with a moving workpiece support, the moving workpiece support may be DC grounded through, for example, a rotary mercury coupler, brushes, or slip rings. However, the moving workpiece support may not be adequately grounded at radio frequencies. The RF ground path should have substantially lower impedance than the plasma for it to be an adequate RF ground. The lack of an adequate RF ground path may make it difficult to control ion energy at the workpiece and reduce the repeatability of the process.

A plasma source with the following properties is thus desired: it can efficiently produce a uniform plasma with the desired properties (plasma density, electron temperature, ion energy, dissociation, etc.) over the workpiece size; it is tunable for uniformity over the operating window (e.g. pressure, power, gas composition); it has stable and repeatable electrical performance even with a moving workpiece; and it does not generate excessive metal contaminants or particles. An intra-chamber electrode assembly might be better able to provide one or more of these properties.

FIG. 1 is a schematic side view diagram of an example of a processing tool. A processing tool 100 has a chamber body 102 enclosing an interior space 104. The interior space 104 can be cylindrical, e.g., to contain a circular workpiece support. At least some of the interior space is used as a plasma chamber or a plasma reactor. The chamber body 102 has a support 106 for providing mechanical support for various components within the interior space 104. For example, the support 106 can provide support for a top electrode 108. The top electrode can be suspended within the interior space 104 and spaced from the ceiling, abut the ceiling, or form a portion of the ceiling. Some portions of the side walls of the chamber body 102 can be grounded independent of the top electrode 108.

A gas distributor 110 is located near the ceiling of the plasma reactor portion of the processing tool 100. In some implementations, the gas distributor 110 is integrated with the top electrode 108 as a single component. The gas distributor 110 is connected to a gas supply 112. The gas supply 112 delivers one or more process gases to the gas distributor 110, the composition of which can depend on the process to be performed, e.g., deposition or etching.

A vacuum pump 113 is coupled to the interior space 104 to evacuate the processing tool. For some processes, the chamber is operated in the Torr range, and the gas distributor 110 supplies argon, nitrogen, oxygen and/or other gases.

A workpiece support 114 for supporting a workpiece 115 is positioned in the processing tool 100. The workpiece support 114 has a workpiece support surface 114a facing the ceiling of the processing tool 100. For example, the workpiece support surface 114a can face the top electrode 108. The workpiece support 114 is operable to rotate about an axis 150. For example, an actuator 152 can turn a drive shaft 154 to rotate the workpiece support 114. In some implementations, the axis 150 is coincident with the center of the workpiece support 114.

In some implementations, the workpiece support 114 includes a workpiece support electrode 116 inside the workpiece support 114. In some implementations, the workpiece support electrode 116 may be grounded or connected to an impedance or circuit which is grounded. In some implementations, an RF bias power generator 142 is coupled through an impedance match 144 to the workpiece support electrode 116. The workpiece support electrode 116 may additionally include an electrostatic chuck, and a workpiece bias voltage supply 118 may be connected to the workpiece support electrode 116. The RF bias power generator 142 may be used to generate plasma, control electrode voltage or electrode sheath voltage, or to control ion energy of the plasma.

Additionally, the workpiece support 114 can have internal passages 119 for heating or cooling the workpiece 115. In some implementations, an embedded resistive heater can be provided inside the internal passages 119.

In some implementations, the workpiece support 114 is heated through radiation, convection, or conduction from a heating element located within a bottom interior space 133.

An intra-chamber electrode assembly 120 is positioned in the interior space 104 between the top electrode 108 and the workpiece support 114. This electrode assembly 120 includes one or more coplanar filaments 300 that extend laterally in the chamber over the support surface 114a of the workpiece support 114. At least a portion of the coplanar filaments of the electrode assembly 120 over the workpiece support 114 extends parallel to the support surface 114a.

Although the left side of FIG. 1 illustrates filaments 300 as parallel to the direction of motion of the workpiece 115 (into and out of the page), the filaments 300 can be at a non-zero angle relative to direction of motion, e.g., substantially perpendicular to direction of motion.

A top gap 130 is formed between the top electrode 108 and the intra-chamber electrode assembly 120. A bottom gap 132 is formed between the workpiece support 114 and the intra-chamber electrode assembly 120.

The interior space 104 can be segmented into one or more zones 101a, 101b by barriers, at least one of which serves as the plasma chamber. The barriers define one or more openings 123 above the workpiece support. In some implementations, the electrode assembly 120 is positioned inside the opening 123. In some implementations, the electrode assembly is placed above the opening 123. In some implementations, the barriers are integrally formed by the support 106, and the openings 123 are formed on the support 106. In some implementations, the opening 123 formed on the support 106 is configured to support the electrode assembly 120.

The electrode assembly 120 is driven by an RF power source 122. The RF power source 122 can apply power to the one or more coplanar filaments of the electrode assembly 120 at frequencies of 1 MHz to over 300 MHz. For some processes, the RF power source 120 provides a total RF power of 100 W to more than 2 kW at a frequency of 60 MHz.

In some implementations, it may be desirable to select the bottom gap 132 to cause plasma generated radicals, ions or electrons to interact with the workpiece surface. The selection of gap is application-dependent and operating regime dependent. For some applications wherein it is desired to deliver a radical flux (but very low ion/electron flux) to the workpiece surface, operation at larger gap and/or higher pressure may be selected. For other applications wherein it is desired to deliver a radical flux and substantial plasma ion/electron flux) to the workpiece surface, operation at smaller gap and/or lower pressure may be selected. For example, in some low-temperature plasma-enhanced ALD processes, free radicals of process gases are necessary for the deposition or treatment of an ALD film. A free radical is an atom or a molecule that has an unpaired valence electron. A free radical is typically highly chemically reactive towards other substances. The reaction of free radicals with other chemical species often plays an important role in film deposition. However, free radicals are typically short-lived due to their high chemical reactivity, and therefore cannot be transported very far within their lifetime. Placing the source of free radicals, namely the intra-chamber electrode assembly 120 acting as a plasma source, close to the surface of the workpiece 115 can increase the supply of free radicals to the surface, improving the deposition process.

The lifetime of a free radical typically depends on the pressure of the surrounding environment. Therefore, a height of the bottom gap 132 that provides satisfactory free radical concentration can change depending on the expected chamber pressure during operation. In some implementations, if the chamber is to be operated at a pressure in the range of 1-10 Torr, the bottom gap 132 is less than 1 cm. In other low(er) temperature plasma-enhanced ALD processes, exposure to plasma ion flux (and accompanying electron flux) as well as radical flux may be necessary for deposition and treatment of an ALD film. In some implementations, if the chamber is to be operated at a pressure in the range of 1-10 Torr, the bottom gap 132 is less than 0.5 cm. Lower operating pressures may operate at larger gaps due to lower volume recombination rate with respect to distance. In other applications, such as etching, lower operating pressure is typically used (less than 100 mTorr) and gap may be increased.

In such applications where bottom gap 132 is small, the plasma generated by the electrode assembly 120 can have significant non-uniformities between the filaments, which may be detrimental to processing uniformity of the workpiece. By moving the workpiece through the plasma having spatial non-uniformities, the effect of the plasma spatial non-uniformities on the process can be mitigated by a time-averaging effect, i.e., the cumulative plasma dose received by any given region of the workpiece after a single pass through the plasma is substantially similar.

The top gap may be selected large enough for plasma to develop between intra-chamber electrode assembly and top electrode (or top of chamber). In some implementations, if the chamber is to be operated at a pressure in the range of 1-10 Torr, the top gap 130 may be between 0.5-2 cm, e.g., 1.25 cm.

The top electrode 108 can be configured in various ways. In some implementations, the top electrode is connected to an RF ground 140. In some implementations, the top electrode is electrically isolated ('floating'). In some implementations, the top electrode 108 is biased to a bias voltage. The bias voltage can be used to control characteristics of the generated plasma, including the ion energy. In some implementations, the top electrode 108 is driven with an RF signal. For example, driving the top electrode 108 with respect to the workpiece support electrode 116 that has been grounded can increase the plasma potential at the workpiece 115. The increased plasma potential can cause an increase in ion energy to a desired value.

The top electrode 108 can be formed of different process-compatible materials. Various criteria for process-computability include a material's resistance to etching by the process gasses and resistance to sputtering from ion bombardment. Furthermore, in cases where a material does get etched, a process-compatible material preferably forms a volatile, or gaseous, compound which can be evacuated by the vacuum pump 113, and not form particles that can contaminate the workpiece 115. Accordingly, in some implementations, the top electrode is made of silicon. In some implementations, the top electrode is made of silicon carbide.

In some implementations, the top electrode 108 may be omitted. In such implementations, RF ground paths may be provided by the workpiece support electrode, a subset of coplanar filaments of the electrode assembly 120, or by a chamber wall or other ground-referenced surfaces in communication with plasma.

In some implementations, a fluid supply 146 circulates a fluid through channels in the intra-chamber electrode assembly 120. In some implementations, a heat exchanger 148 is coupled to the fluid supply 146 to remove or supply heat to the fluid.

Depending on chamber configuration and supplied processing gasses, the plasma reactor in the processing tool 100 could provide an ALD apparatus, an etching apparatus, a plasma treatment apparatus, a plasma-enhanced chemical vapor deposition apparatus, a plasma doping apparatus, or a plasma surface cleaning apparatus.

Figure 2A:
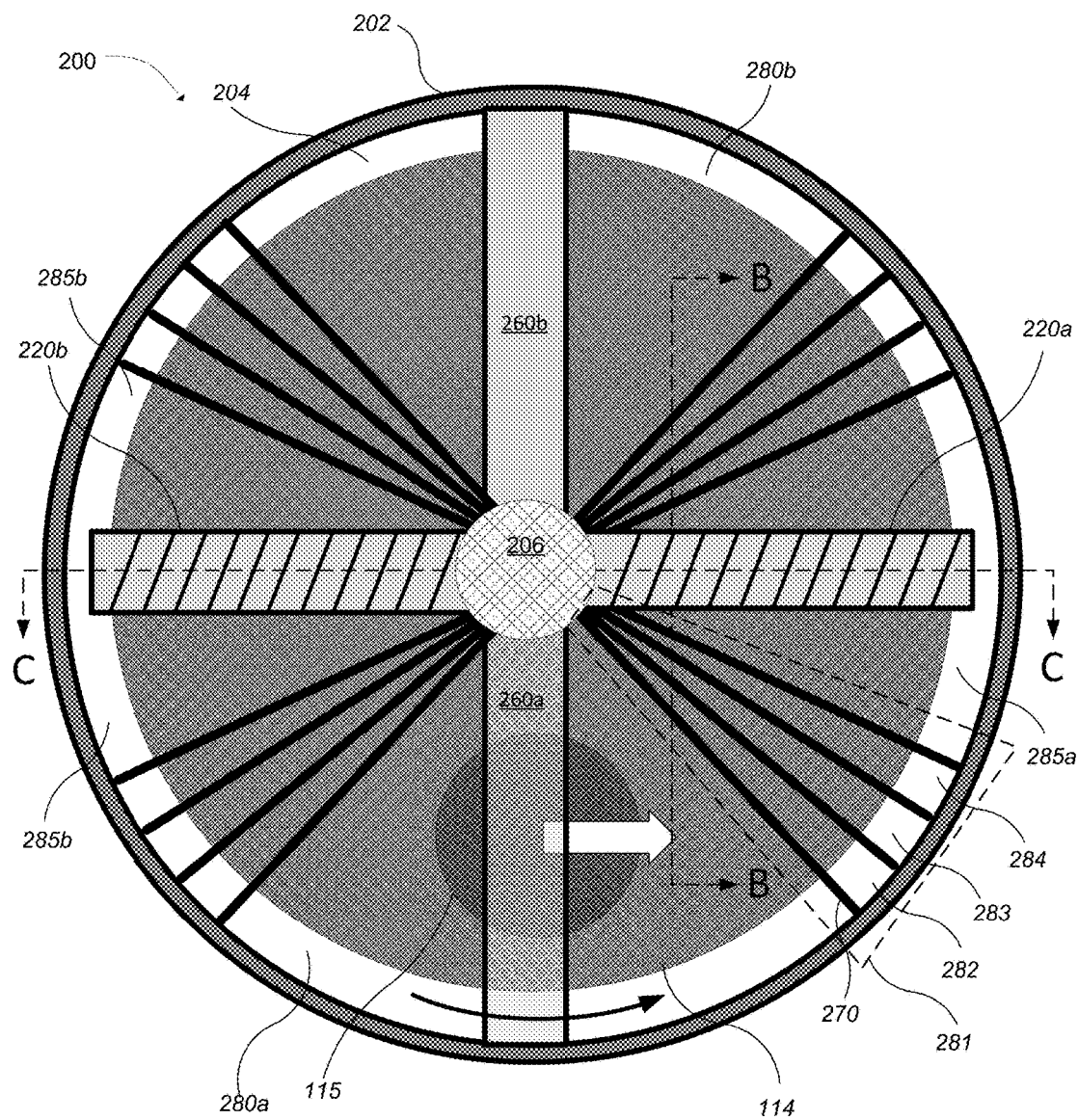
FIG. 2A is a schematic top view diagram of an example of a processing tool.

FIG. 2A is a schematic top view diagram of an example of a processing tool 200. The processing tool 200 is similar to the processing tool 100 except as described. The processing tool 200 has a cylindrical chamber body 202, an interior space 204 having a cylindrical shape, a support 206, electrode assemblies 220, and precursor stations 260. The support 206 is located at the center of the processing tool 200, and multiple radial partitions 270 are formed to partition the interior space 204 into multiple processing zones. For example, the multiple processing zones can be configured to have a shaped of a wedge, e.g., a circular section or an equilateral triangle, either possibly cut off at the apex. Processing zones can be configured in various ways to achieve various functions necessary for operation of the processing tool 200.

A precursor processing zone is configured to treat the workpiece 115 with one or more precursors, e.g., for an ALD process. For example, a first precursor station 260a positioned within a precursor processing zone 280a can be configured to flow or pump a chemical precursor A, treating the workpiece 115 as the workpiece 115 moves under the precursor station 260a. Then, the precursor station 260a can treat the workpiece 115 with a chemical precursor B, preparing the surface of the workpiece 115, e.g., for an ALD film-forming plasma treatment of the surface.

In some implementations, the precursor processing zone 280 includes multiple subzones having respective precursor station 260 for respective chemical precursors. In some implementations, the subzones are sequentially arranged along a path of the workpiece 115. In some implementations, the movement of workpiece 115 is halted during a precursor surface treatment. In some implementations, the workpiece 115 moves continuously through the precursor processing zone 280.

A gas isolation zone 281 is configured to provide spatial isolation of respective processing environments of multiple processing zones, e.g., a first processing zone and a second processing zone. The gas isolation zone 281 can include a first pumping zone 282, a purging zone 283, and a second pumping zone 284, each separated by a respective radial partitions 270. In a conventional system, the isolation of processing environments may be provided by a gas-tight seal between the first and second processing zones. However, due to the rotating workpiece support 114, providing such seal may not be practical. Instead, a level of isolation sufficient for plasma processing applications, e.g., ALD, can be provided by inserting the gas isolation zone 281 between the first and the second processing zones.

Figure 2B:
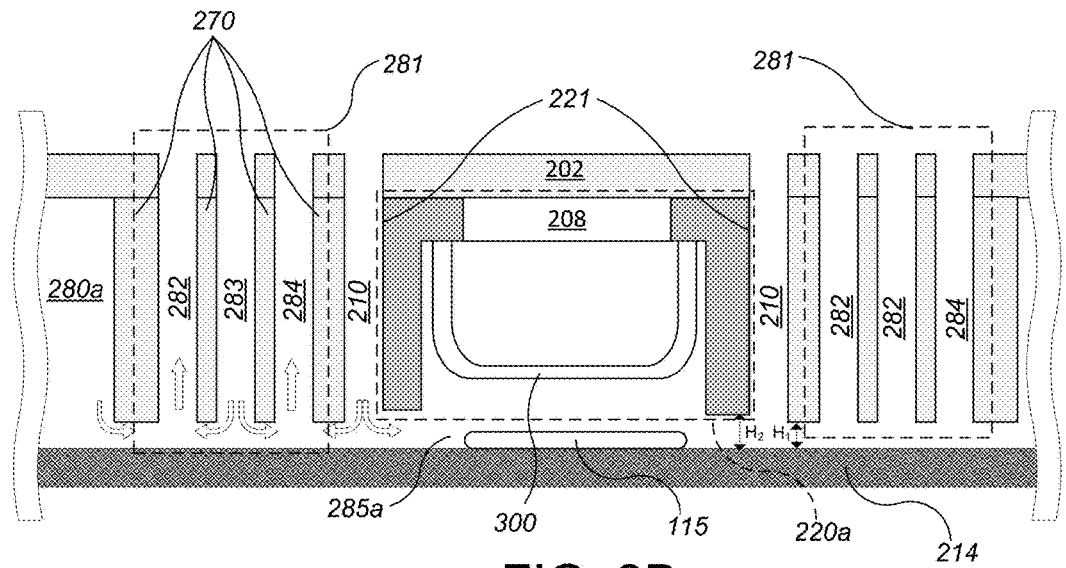
FIGS. 2B-2C are cross sectional side view diagrams of an example of a processing tool.

Referring to FIG. 2B, a cross sectional view of a portion of the processing tool 200 along a cross section line B is illustrated. During operation, the first pumping zone 282 adjacent to the first processing zone (e.g., precursor processing zone 280a) creates a negative pressure differential relative to the first processing zone. For example, the negative pressure differential can be generated using a vacuum pump. This negative pressure differential causes the process gasses leaking out of the first processing zone to be pumped out through the first pumping zone 282, as indicated by an arrow. Similarly, the second pumping zone 284 adjacent to the second processing zone provides a negative pressure differential relative to the second processing zone (e.g., plasma treatment zone 285a).

The purging zone 283 positioned between the first pumping zone 282 and the second pumping zone 284 supplies a purging gas. Examples of the purging gas include non-reactive gases such as argon and nitrogen. Due to the negative pressure differentials created by the first and second pumping zones, the purging gas supplied by the purging zone 283 is pumped into the first and second pumping zones, as indicated by the arrows. The presence of the purging gas can prevent the respective process gasses of the first and the second processing zones from mixing with one another, which may cause unwanted chemical reaction that results in unwanted deposition, etching, or debris generation.

A first gap height $H_1$ provides clearance between the radial partitions 270 and the workpiece support 114. The first gap height can be determined based on providing sufficient clearance for the workpiece 115 to pass through, while reducing process gas leakage into the pumping zones 282 and 284. For example, the first gap height can range from 2-4 mm, e.g., 3 mm.

Referring back to FIG. 2A, a plasma treatment zone 285 is configured to treat the workpiece 115 with plasma. For example, the electrode assembly 220a positioned within the plasma treatment zone 285a can generate plasma for treating the surface of the workpiece 115. The precursor-treated surface of the workpiece 115, which have moved through the gas isolation zone 281, is treated with the plasma generated by the electrode assembly 220a. In some implementations, the plasma treatment completes a deposition cycle of a single atomic layer of a first ALD film.

In some implementations, the electrode assembly 220 is formed in a rectangular shape as shown. In some implementations, the electrode assembly 220 is formed in a wedge shape.

Referring back to FIG. 2B, in some implementations, process gasses for the plasma treatment zone 285 is provided through gas inlets 210 formed adjacent to the electrode assembly 220. In particular, the gas inlet 210 can be provided at the edge of the gas isolation zone 281 adjacent the plasma processing region 285a. For example, a passage can be formed between one of the partitions 270 and an outer wall 221 of the electrode assembly 220a.

A second gap height $H_2$ provides clearance between the electrode assembly 220 and the workpiece support 114. The second gap height can be determined based on providing sufficient clearance for the workpiece 115 to pass through and providing process gas to an interior region of the electrode assembly 220, while reducing process gas flow into the pumping zones 282 and 284. For example, the second gap height can range from 1-3 mm, e.g., 2 mm. In some implementations, the gas inlet is formed on the ingress side of the workpiece 115. In some implementations, the gas inlet is formed towards the radial outer edge of the electrode assembly, near the chamber wall 202. In some implementations, the gas inlet is formed towards the center of the workpiece support 114, e.g., near the axis 150.

In some implementations, a top electrode 208 is formed as a part of or supported by the electrode assembly 220a. For example, the top electrode 208 can be supported by a ceiling plate 221a.

Figure 2C:
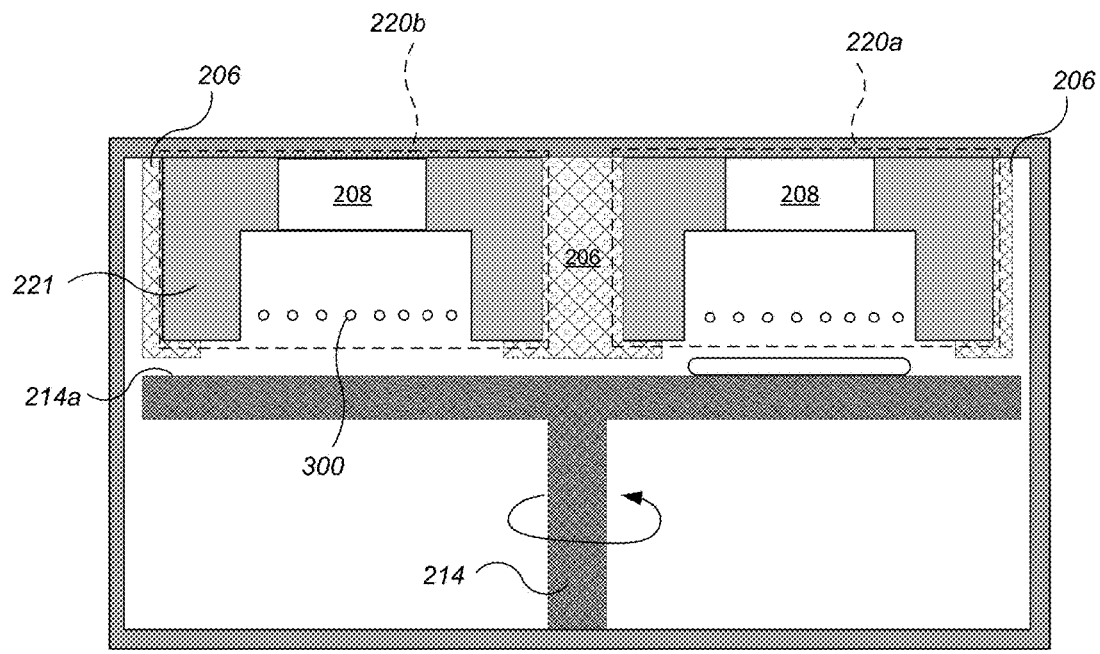

Referring to FIG. 2C, a cross sectional view of a portion of the processing tool 200 along a cross section line C is illustrated. In some implementations, the support 206 is configured to provide mechanical support for the electrode assemblies 220a and 220b as shown.

In some implementations, the processing tool 200 includes a second precursor processing zone 280b and a second plasma treatment zone 285b. The zones 280b and 285b can be configured to deposit a second ALD film. In some implementations, the second ALD film is the same as the first ALD film deposited by zones 280a and 285a. Such implementations may provide improved deposition speed of a single ALD film. In some implementations, the second ALD film is different from the first ALD. In such implementations, two different ALD films can be deposited in an alternating fashion. In general, the processing tool 200 can be configured to deposit 2, 3, 4, or more types of ALD films.

In general, the workpiece 115 may make a single pass or may make multiple passes through the processing zones. For example, direction of rotation may be alternated to make multiple pass through a specific processing zone.

In general, processing zones can be arranged in any sequence. For example, a precursor processing zone can be followed by 2 different plasma treatment zones having same or different plasma characteristics.

With respect to either FIG. 1 or FIGS. 2A-2C, the electrode assembly 120 or 220 includes one or more coplanar filaments 300 that extend laterally in the chamber over the support surface of the workpiece support. At least a portion of the coplanar filaments of the electrode assembly over the workpiece support extends parallel to the support surface. The filaments 300 can be at a non-zero angle relative to direction of motion, e.g., substantially perpendicular to direction of motion.

The electrode assembly can include side walls 221 that surround the electrode plasma chamber region. The side walls can be formed of a process-compatible material, e.g., quartz. In some implementations, the filaments project laterally out the side walls. In some implementations, the ends of the filaments 300 extend out of the ceiling of the electrode assembly and turn to provide the portion that is parallel to the support surface for the workpiece (see FIG. 2C).

Figure 3A:
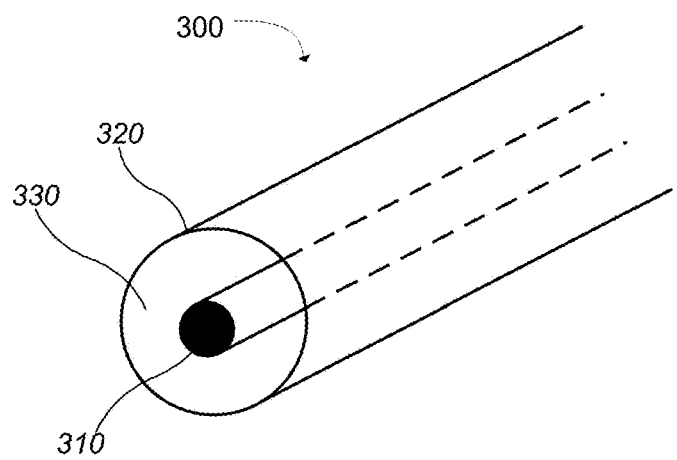
FIGS. 3A-3C are schematic cross-sectional perspective view diagrams of various examples of a filament of an intra-chamber electrode assembly.
Figure 3B:
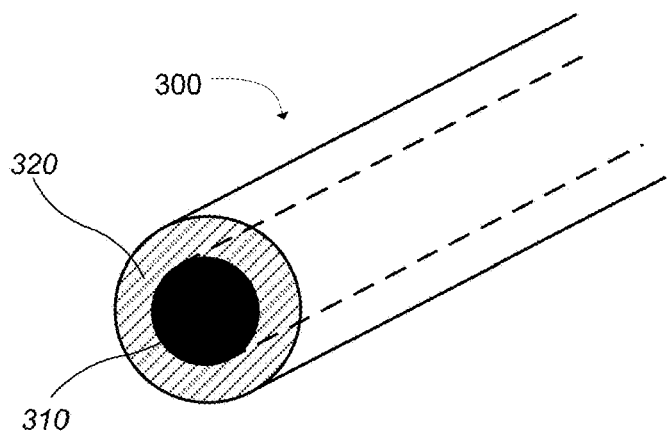
Figure 3C:
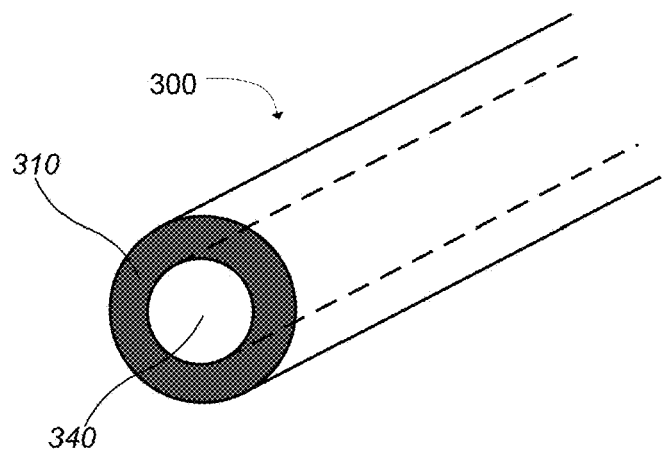

FIGS. 3A-C are schematic diagrams of various examples of a filament of an intra-chamber electrode assembly. Referring to FIG. 3A, a filament 300 of the intra-chamber electrode assembly 120 is shown. The filament 300 includes a conductor 310 and a cylindrical shell 320 that surrounds and extends along the conductor 310. A channel 330 is formed by the gap between the conductor 310 and the cylindrical shell 320. The cylindrical shell 320 is formed of a non-metallic material that is compatible with the process. In some implementations, the cylindrical shell is semiconductive. In some implementations, the cylindrical shell is insulative.

The conductor 310 can be formed of various materials. In some implementations, the conductor 310 is a solid wire, e.g., a single solid wire with a diameter of 0.063". Alternatively, the conductor 310 can be provided by multiple stranded wires. In some implementations, the conductor contains 3 parallel 0.032" stranded wires. Multiple stranded wires can reduce RF power losses through skin effect. In some implementations, the conductor 310 is formed from Litz wires, which can further reduce skin effect.

A material with high electrical conductivity, e.g., above $10^7$ Siemen/m, is used, which can reduce resistive power losses. In some implementations, the conductor 310 is made of copper or an alloy of copper. In some implementations, the conductor is made of aluminum.

Undesired material sputtering or etching can lead to process contamination or particle formation. Whether the intra chamber electrode assembly 120 is used as a CCP or an ICP source, undesired sputtering or etching can occur. The undesired sputtering or etching may be caused by excessive ion energy at the electrode surface. When operating as a CCP source, an oscillating electric field around the cylindrical shell is necessary to drive the plasma discharge. This oscillation leads to sputtering or etching of materials, as all known materials have a sputtering energy threshold that is lower than the corresponding minimum operating voltage of a CCP source. When operated as an ICP source, capacitive coupling of the filament 300 to the plasma creates an oscillating electric field at nearby surfaces, which also causes sputtering of materials. The problems resulting from undesired material sputtering or etching may be mitigated by using a process-compatible material for the outer surface of the filament 300 exposed to the interior space 104 (e.g., the cylindrical shell 320).

In some implementations, the cylindrical shell 320 is formed of a process-compatible material such as silicon, e.g., a high resistivity silicon, an oxide material, a nitride material, a carbide material, a ceramic material, or a combination thereof. Examples of oxide materials include silicon dioxide (e.g., silica, quartz) and aluminum oxide (e.g., sapphire). Examples of carbide materials include silicon carbide. Ceramic materials or sapphire may be desirable for some chemical environments including fluorine-containing environments or fluorocarbon containing environments. In chemical environments containing ammonia, dichlorosilane, nitrogen, and oxygen, use of silicon, silicon carbide, or quartz may be desirable.

In some implementations, the cylindrical shell 320 has a thickness of 0.1 mm to 3 mm, e.g., 2 mm.

In some implementations, a fluid is provided in the channel 330. In some implementations, the fluid is a non-oxidizing gas to purge oxygen to mitigate oxidization of the conductor 310. Examples of non-oxidizing gases are nitrogen and argon. In some implementations, the non-oxidizing gas is continuously flowed through the channel 330, e.g., by the fluid supply 146, to remove residual oxygen or water vapor.

The heating of conductor 310 can make the conductor more susceptible to oxidization. The fluid can provide cooling to the conductor 310, which may heat up from supplied RF power. In some implementations, the fluid is circulated through the channel 330, e.g., by the fluid supply 146, to provide forced convection temperature control, e.g., cooling or heating.

In some implementations, the fluid may be near or above atmospheric pressure to prevent breakdown of the fluid. For example, gas breakdown or unwanted plasma formation in tube may be prevented by providing fluid pressure above 100 Torr.

Referring to FIG. 3B, in some implementations of the filament 300, the conductor 310 has a coating 320. In some implementations, the coating 320 is an oxide of the material forming the conductor (e.g., aluminum oxide on an aluminum conductor). In some implementations, the coating 320 is silicon dioxide. In some implementations, the coating 320 is formed in-situ in the plasma reactor of the processing tool 100 by, for example, a reaction of silane, hydrogen, and oxygen to form a silicon dioxide coating. In-situ coating may be beneficial as it can be replenished when etched or sputtered. In-situ coating can have a range of thicknesses, ranging from 100 nm to 10 µm.

Referring to FIG. 3C, in some implementations of the filament 300, the conductor 310 is hollow, and a hollow channel 340 is formed inside the conductor 310. In some implementations, the hollow channel 340 can carry a fluid as described in FIG. 3A. A coating of the process-compatible material can cover the conductor 310 to provide the cylindrical shell 320. In some implementations, the coating 320 is an oxide of the material forming the conductor (e.g., aluminum oxide on an aluminum conductor). In some implementations, the hollow conductor 310 has an outer diameter of 2 mm, with a wall thickness of 0.5 mm.

Figure 4A:
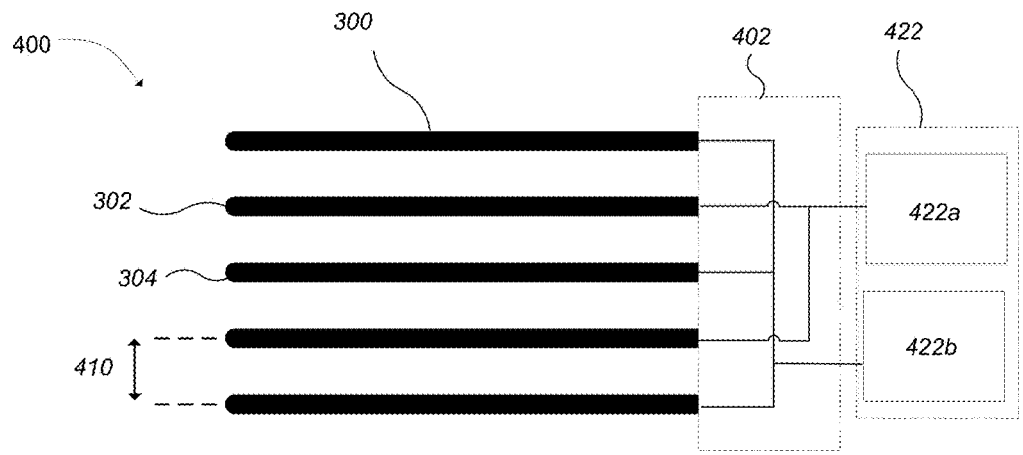
FIG. 4A is a schematic top view diagram of a portion of an intra-chamber electrode assembly.

FIG. 4A is a schematic diagram of a portion of an intra-chamber electrode assembly. An intra-chamber electrode assembly 400 includes multiple coplanar filaments 300 attached at a support 402. An electrode array is formed by the multiple coplanar filaments 300. The electrode assembly 400 can provide the electrode assembly 120. In some implementations, at least over the region corresponding to where the workpiece is processed, the filaments 300 extend in parallel to each other.

The filaments 300 are separated from one another by a filament spacing 410. The spacing 410 can impact plasma uniformity. If the spacing is too large, then the filaments can create shadowing and non-uniformity. On the other hand, if the spacing is too small, the plasma cannot migrate between the top gap 130 and the bottom gap 132, and non-uniformity will be increased or free radical density will be reduced.

In general, a desired value for filament spacing 410 is dependent on several factors. Examples of such factors include chamber pressure, RF power, distance between the filament 300 to the workpiece 115, and process gas composition. For example, when operating at lower pressure, e.g., below 2 Torr, and with large distance between the filament and the workpiece, e.g., greater than 3 mm, the filament spacing 410 may be increased.

In some implementations, the filament spacing 410 is uniform across the assembly 400. The filament spacing 410 can range from 3 mm to 20 mm, e.g., 8 mm.

Figure 4B:
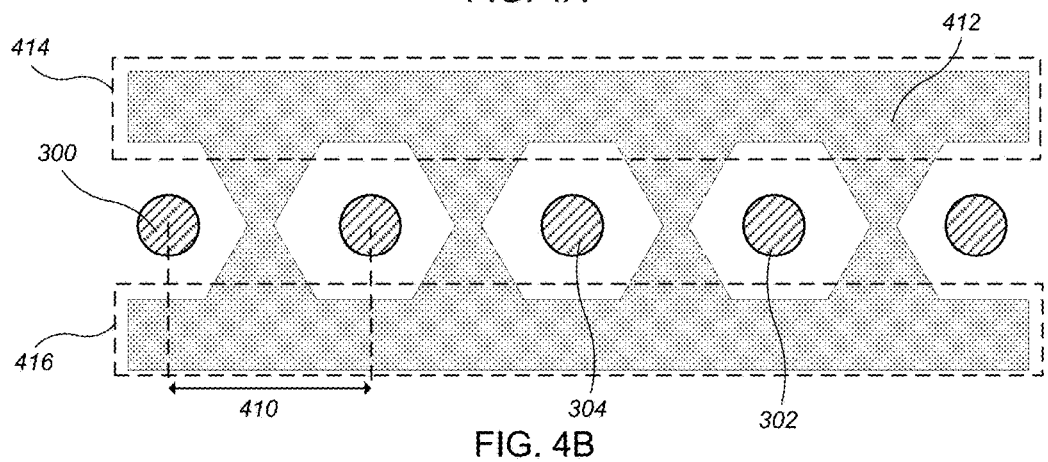
FIGS. 4B-C are cross-sectional schematic side view diagrams of an intra-chamber electrode assembly with different plasma region states.
Figure 4C:
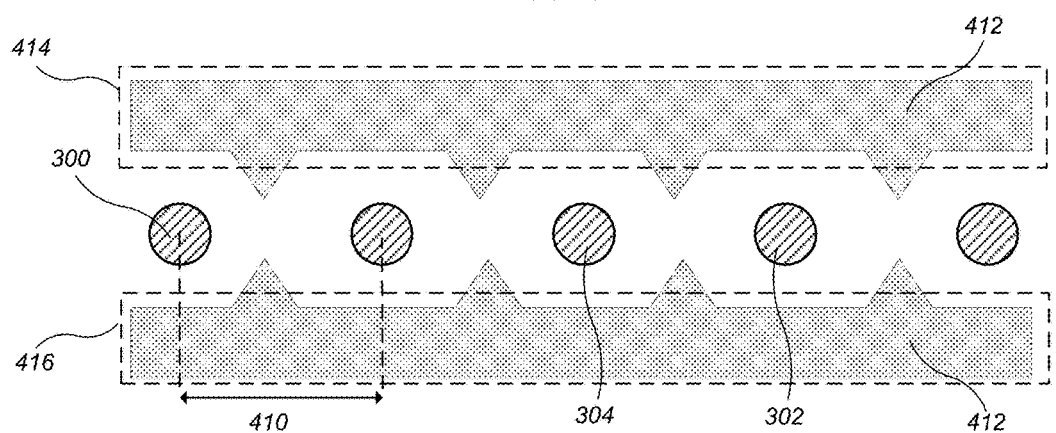

FIGS. 4B-C are cross-sectional schematic diagrams of an intra-chamber electrode assembly with different plasma region states. Referring to FIG. 4B, in some operating conditions, a plasma region 412 surrounds the filaments 300. Examples of such operating conditions can include all filaments being driven with the same RF signal (i.e., "monopolar"), with a grounded top electrode. The plasma region 412 has an upper plasma region 414 and a lower plasma region 416. The upper plasma region 414 can be located at the top gap 130 and the lower plasma region 416 can be located at the bottom gap 132. As shown in FIG. 4B, the upper plasma region 414 and the lower plasma region 416 is connected through the gaps between the filaments 300, forming a continuous plasma region 412. This continuity of the plasma regions 412 is desirable, as the regions 414 and 416 'communicate' with each other through exchange of plasma. The exchanging of plasma helps keep the two regions electrically balanced, aiding plasma stability and repeatability.

Referring to FIG. 4C, in this state, the upper plasma region 414 and the lower plasma region 416 is not connected to each other. This 'pinching' of the plasma region 412 is not desirable for plasma stability. The shape of the plasma region 412 can be modified by various factors to remove the plasma region discontinuity or improve plasma uniformity.

In general, the regions 412, 414, and 416 can have a wide range of plasma densities, and are not necessarily uniform. Furthermore, the discontinuities between the upper plasma region 414 and the lower plasma region 416 shown in FIG. 4C represents a substantially low plasma density relative to the two regions, and not necessarily a complete lack of plasma in the gaps.

In some operating conditions, e.g., top electrode is absent or floating, and the workpiece support electrode is grounded, plasma region 414 may not be formed, or have low plasma density.

In some implementations, the intra-chamber electrode assembly 400 can include a first group and a second group of filaments 300. The first group and the second group can be spatially arranged such that the filaments alternate between the first group and the second group. For example, the first group can include the filament 302, the second group can include the filaments 300 and 304. The first group can be driven by a first terminal 422a of an RF power supply 422 and the second group can be driven by a second terminal 422b of the RF power supply 422. The RF power supply 422 can be configured to provide a first RF signal at the terminal 422a and a second RF signal at terminal 422b. The first and second RF signals can have a same frequency and a stable phase relationship to each other. For example, the phase difference between the first and second RF signals can be 0 or 180 degrees. In some implementations, the phase relationship between the first and the second RF signals provided by the RF power supply 422 can be tunable between 0 and 360. In some implementations, the RF supply 422 can include two individual RF power supplies that are phase-locked to each other.

In some operating conditions, e.g., when the phase difference between the first and second RF signals is 180, the resulting plasma region may be concentrated between the filaments.

The top gap 130 is a factor affecting the shape of the plasma region. When the top electrode 108 is grounded, reducing the top gap 130 typically leads to a reduction of plasma density in the upper plasma region 414. Specific values for the top gap 130 can be determined based on computer modelling of the plasma chamber. For example, the top gap 130 can be 3 mm to 8 mm, e.g., 4.5 mm.

The bottom gap 132 is a factor affecting the shape of the plasma region. When the workpiece support electrode 116 is grounded, reducing the bottom gap 132 typically leads to a reduction of plasma density in the lower plasma region 416. Specific values for the bottom gap 132 can be determined based on computer modelling of the plasma chamber. For example, the bottom gap 132 can be 3 mm to 9 mm, e.g., 4.5 mm.

In general, the chamber pressure is a factor affecting the shape of the plasma region.

FIGS. 5A-C are schematic diagrams of various examples of intra-chamber electrode assembly configurations. Referring to FIG. 5A, an intra-chamber electrode assembly 500 includes a first interdigitated electrode subassembly 520 and a second interdigitated electrode subassembly 530. The subassembly 520 and 530 each has multiple parallel filaments 300 that are connected by a bus 550 at one end. In some implementations, the bus 550 connecting the filaments 300 is located outside of the interior space 104. In some implementations, the bus 550 connecting the filaments 300 is located in the interior space 104. The first interdigitated electrode subassembly 520 and a second interdigitated electrode subassembly 530 are oriented parallel to each other such that the filaments of the subassemblies 520 and 530 are parallel to each other.

Referring to FIG. 5B, an intra-chamber electrode assembly 502 includes a first electrode subassembly 522 and a second electrode subassembly 532 configured such that the filaments of the subassemblies 522 and 532 extend at a non-zero angle, e.g., perpendicular, to each other.

The intra-chamber electrode assembly 502 can be driven with RF signals in various ways. In some implementations, the subassembly 522 and subassembly 532 are driven with a same RF signal with respect to an RF ground. In some implementations, the subassembly 522 and subassembly 532 are driven with a differential RF signal. In some implementations, the subassembly 522 is driven with an RF signal, and subassembly 532 is connected to an RF ground.

Referring to FIG. 5C, an intra-chamber electrode assembly 504 includes a first electrode subassembly 524 and a second electrode subassembly 534 that are overlaid. The first electrode subassembly 524 and the second electrode subassembly 534 each has multiple parallel filaments 300 that are connected by buses 560 and 562 in both ends. The first electrode subassembly 524 and the second electrode subassembly 534 are configured such that the filaments of the subassemblies 524 and 534 are parallel to each other, with the filaments of the subassemblies 524, 534 arranged in alternating pattern.

The intra-chamber electrode assembly 504 can be driven with RF signals in various ways. In some implementations, the subassembly 524 and subassembly 534 are driven with a same RF signal with respect to an RF ground. In some implementations, the subassembly 524 and subassembly 534 are driven with a differential RF signal. In some implementations, the subassembly 524 is driven with an RF signal, and the subassembly 534 is connected to an RF ground.

In some implementations, the intra-chamber electrode assembly 504 is driven in a single-ended manner with an RF signal using a center-feed 540. The center-feed 540 is connected to an X-shaped current splitter 542 at the center. The four corners of the subassemblies 524 and 534 are connected to the X-shaped current splitter 542 using vertical feed structures.

In general, differential driving of the subassemblies 520, 522, 524 and the respective subassemblies 530, 532, 534 can improve plasma uniformity or process repeatability when an adequate RF ground cannot be provided (e.g., RF ground through a rotary mercury coupler, brushes, or slip rings).

Figure 6A:
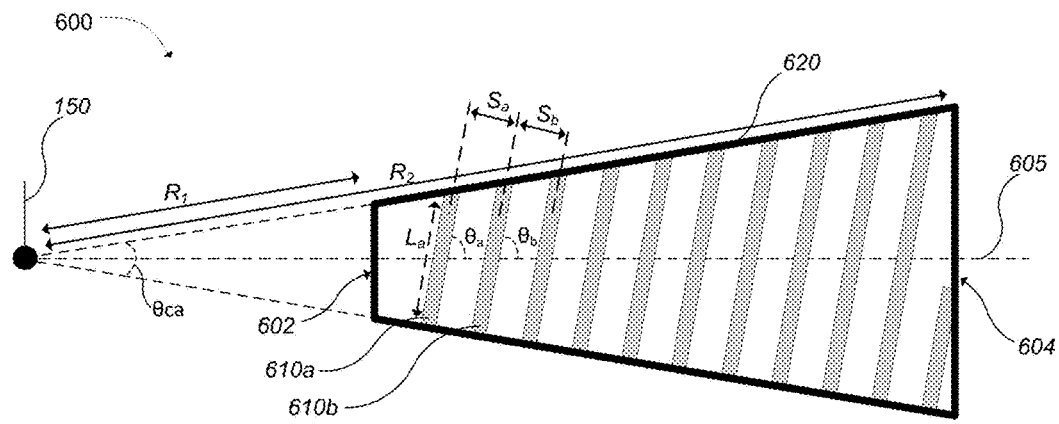
FIG. 6A is a schematic top view diagram of an example of a wedge-shaped electrode assembly.

FIG. 6A is a schematic top view diagram of an example of a wedge-shaped electrode assembly for generating a wedge-shaped plasma region. A wedge-shaped electrode assembly 600 has multiple coplanar filaments 610 and a frame 620. The electrode assembly 600 is similar to the electrode assembly 120, 220 and 400, except as described. The frame 620 has a first end 602, a second end 604, a central angle θca, an inner radius $R_1$, an outer radius $R_2$, and a bisector 605. The first end 602 is the short end of the electrode assembly 600, sometimes called an apex. The second end 604 is the longer end of the electrode assembly 600, sometime called a base. The multiple coplanar filaments 610 are similar to the filaments 300, except as described. Each coplanar filament 610 has a respective length L, respective angle θ (theta) with respect to the bisector 605. Length L is defined to be a linear portion of the coplanar filaments 610 in a region parallel and adjacent to the workpiece support surface, e.g., 114a. Each adjacent pair of coplanar filaments 610 are separated by respective separations S, defined as the center-to-center distance between the adjacent filaments. For non-parallel filaments, the separation S is defined as the smallest center-to-center spacing along the lengths of the adjacent filament pair.

There are various considerations for determining angle theta of the filaments 610. One consideration for determining the angle theta is the trajectory of workpiece 115 as it moves under the electrode assembly 600. In some situations, the plasma generated by the electrode assembly 600 can have non-uniformities in plasma that extend along the direction of the filaments 610. For example, an elongated region of reduced plasma density may exist between a pair of filaments 610 in certain operating conditions. If a point on the surface of the workpiece travels along such region of reduced plasma density, the point will receive reduced plasma exposure dose, resulting in process non-uniformity. By arranging the filaments to have an appropriate value of theta (e.g., smaller or larger than 90°, excluding) 90°, such tangential travel along regions of reduced plasma density can be reduced, improving process uniformity. For example, by setting the theta to 60°, points on the surface of the workpiece pass under multiple filaments, being exposed to local plasma regions having reduced density as well as nominal density along the way, resulting in time-averaging of the plasma exposure dose. In some implementations, the respective theta of the multiple coplanar filaments 610 are equal, i.e., the filaments are parallel.

In some implementations, the respective theta of the filaments 610 are different based on their respective locations within the electrode assembly 600. For example, the respective theta monotonically increases for filaments near the apex 602 to filaments near the base 604 of the assembly 600 to maintain equal lengths of the filaments 610 across the electrode assembly 600. Having filaments of equal lengths may improve uniformity when the assembly 600 is operated as an ICP source.

In general, the number of coplanar filaments 610 is determined by the size of the plasma region, the theta, and the separation S to achieve desired plasma region characteristics, e.g., plasma density, uniformity.

In general, the separation S can be determined based on considerations discussed in FIG. 4 regarding the filament spacing 410.

The frame 620 defines the shapes of electrode assembly 600 and the shape of the plasma region formed by the electrode assembly 600. The inner radius, the outer radius and the central angle determines the size of the wedge-shaped electrode, which in turn defines the size of the plasma region. The size of the frame can be determined based on foregoing discussion of plasma region sizing in relation to FIG. 5.

The frame 620 can be formed of different process-compatible materials. Suitable process-compatible materials include those described in relation to cylindrical shell 320 e.g., quartz. Other examples of process-compatible materials include ceramics (e.g., Aluminum Oxide, Aluminum Nitride), and various nitrides of silicon (e.g., SiN, $Si_3N_4$).

While frame 620 has been described in relation to the wedge-shaped electrode assembly 600, the filaments 610 can be formed and arranged to have the described wedge shape without the frame 620 to achieve similar results.

An example of the wedge-shaped electrode assembly has the following design properties: $R_1$=91 mm, $R_2$=427 mm, central angle=31°, theta=60°, filament center-to-center separation=15 mm, number of filaments=20, frame material=quartz.

Figures 6B, 6C:
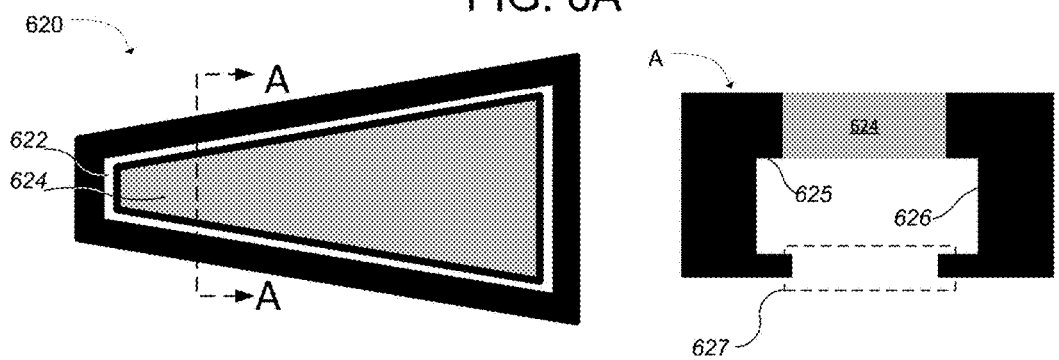
FIG. 6B is a schematic top view diagram of an example of a frame of a wedge-shaped electrode assembly.
FIG. 6C is a cross sectional side view diagram of an example of a frame of a wedge shaped electrode assembly.

Referring to FIG. 6B, in some implementations, the frame 620 has a cutout 622. The cutout 622 can be shaped to fit a wedge-shaped top electrode 624. The wedge-shaped top electrode 624 can be grounded or biased to a bias voltage. The wedge-shaped top electrode 624 can be formed of various process compatible materials, e.g., silicon. In some implementations, the wedge-shaped electrode is shaped to be inserted into the cutout 622 to fill the cutout 622.

Referring to FIG. 6C, a cross sectional view of a portion of the frame 620 along a cross section line A is illustrated. In some implementations, the frame has an upper portion 625, an inner sidewall 626, and an opening 627.

In general, the respective lengths L of the multiple coplanar filaments 610 are set to generate a plasma region of desired shape. The frame 620 can be shaped to provide support to the coplanar filaments 610. In some implementations, the ends of the coplanar filaments 610 are supported by the inner sidewall 626 of the frame 620, similar to the configuration shown in FIG. 6A. In some implementations, the ends of the coplanar filaments 610 are bent (e.g. 90°) to be supported by the upper portion 625 of the frame 620, as shown in the electrode assembly 220a of FIG. 2B. In some implementations, the opening 627 of the frame 620 can determine the shape of the plasma region.

Figure 6D:
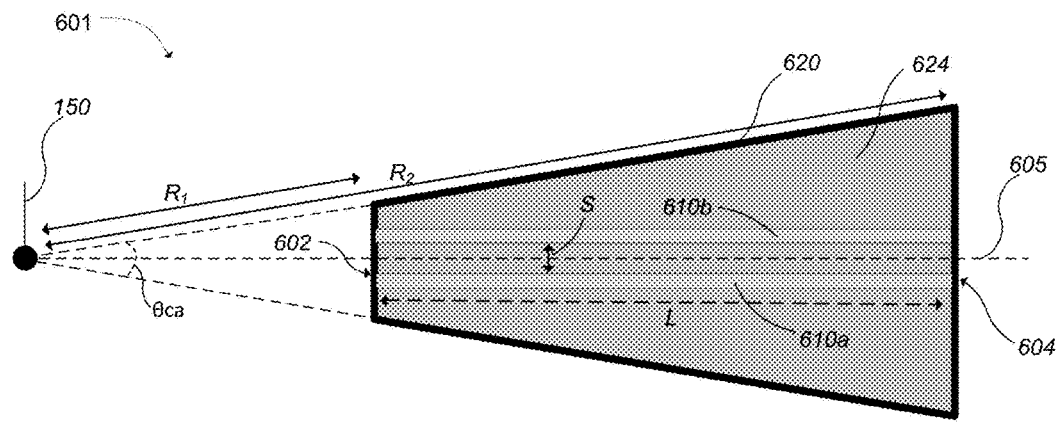
FIG. 6D is a schematic top view diagram of an example of a wedge-shaped electrode assembly.

In some implementations, the theta is close to 0, e.g., <20°. Referring to FIG. 6D, the assembly 601 has two filaments, and the filaments are arranged with theta=0°, i.e., the filaments are parallel to the bisector 605. The frame 620 of the assembly 601 has the cutout 622, and the wedge-shaped electrode 624. The wedge-shaped electrode 624 can be grounded. In such a configuration, the shaped of the plasma region generated by the electrode assembly 601 is affected by the interaction between the filaments 610 and the wedge-shaped electrode 624, resulting in a wedge-shaped plasma region. In configuration where theta is close to 0°, the effects of plasma non-uniformity parallel to the filament 610 can be reduced as the direction of travel of the workpiece 115 is substantially close to 90° with respect to the orientation of the filaments 610.

Figure 7A:
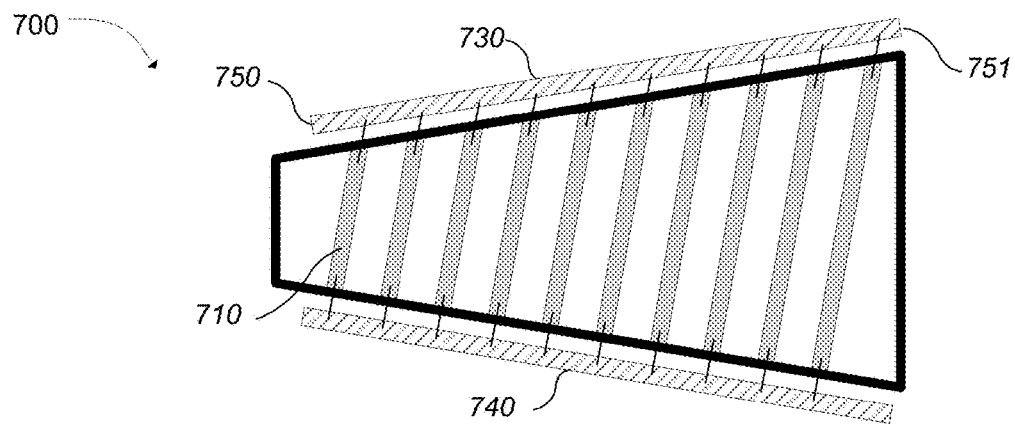
FIGS. 7A-7C are conceptual schematic diagrams of examples of electrical configurations of a wedge-shaped electrode assembly.
Figure 7B:
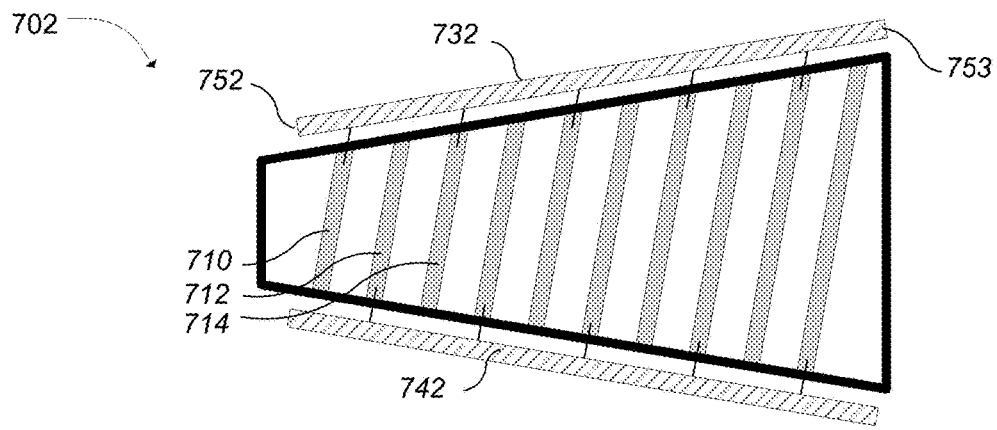
Figure 7C:
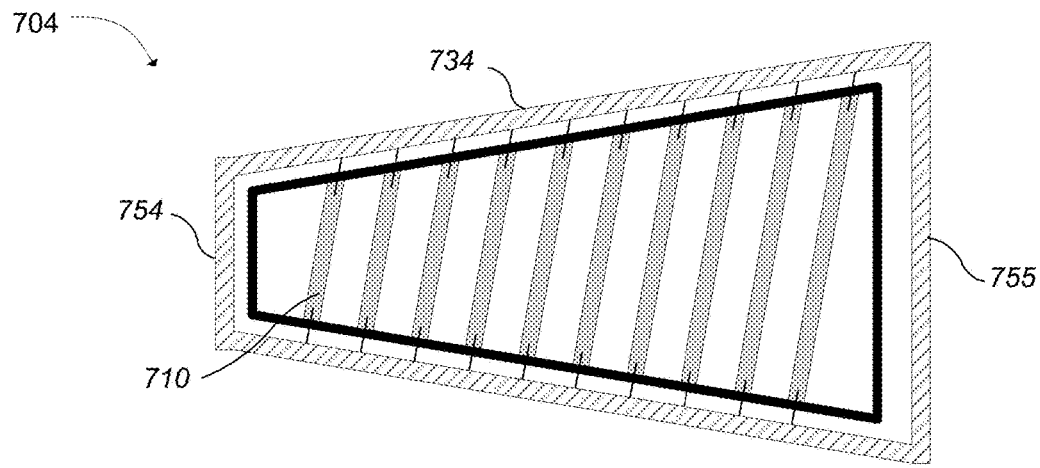

FIGS. 7A-7C are conceptual schematic diagrams of various electrical configurations of a wedge-shaped electrode assembly. The filaments of the electrode assembly can be electrically connected in various different configurations. Referring to FIG. 7A, an electrode assembly 700 similar to the electrode assembly 600, and has a first bus 730 and a second bus 740. The first bus 730 and the second bus 740 can be located on opposite sides of the chamber body 102, e.g., outside the chamber.

The first bus 730 has a first end 750 and a second end 751 opposite to the first end 750. The first bus 730 and the second bus 740 are electrically connected to the respective opposite ends of each filament 710 of the electrode assembly 700. The filament 710 is similar to the filament 300, except as described. The electrode assembly 700 can be driven in various ways using one or more RF power sources.

In some implementations, a first RF power source drives the first bus 730, and the second bus 740 is connected to an RF ground. In such a configuration, RF current flows across the filaments 710, and the electrode assembly may work as a predominantly ICP plasma source.

In some implementations, the first RF power source drives the first bus 730, and the second bus 740 is electrically floating. In such a configuration, the electrode assembly may work as a predominantly CCP plasma source. The RF current return path may be provided by the chamber body 102, top electrode 108, the wedge-shaped top electrode 624, or by the workpiece support electrode 116.

In some implementations, the first RF power source drives the first bus 730 at the first end 750, a second RF power source drives the first bus 730 at the second end 751, and the second bus 740 is connected to an RF ground. In such a configuration, the electrode assembly may work as a predominantly ICP plasma source.

In some implementations, the first RF power source drives the first bus 730, and the second RF power source drives the second bus 740.

In general, a RF driving point at which the RF power source connects to a bus is selected to optimized uniformity of the resulting plasma. For example, the driving point location can be selected based on minimizing non-uniformity in RF signal amplitude experienced by individual filaments 710.

In some implementations, the intra-chamber electrode assembly can include a first group and a second group of coplanar filaments. The filaments of the first group and the second group can be arranged in an alternating pattern along the direction perpendicular to their longitudinal axis. As such, that the coplanar filaments alternate between the first group and the second group.

Referring to FIG. 7B, an electrode assembly 702 similar to the electrode assembly 600 has a first group can include the coplanar filaments 710 and 714, and a second group that include the coplanar filaments 712. The first group is electrically connected to a first bus 732, and the second group is electrically connected to a second bus 742. An end of each filament farther from the bus to which it is connected can be "floating" or grounded. If the ends of the filaments are floating, the two groups of filaments can be considered to form an interdigited array.

The first bus 732 can have a first end 752 and a second end 753 opposite to the first end 752. In some implementations, the first RF power source drives the first bus 732 with a first RF signal, and the second RF power source drives the second bus 742 with a second RF signal. The first and second RF signals may have the same frequency and a stable phase relationship to each other. For example, the phase difference between the first RF signal and the second RF signal can be 0 degrees or 180 degrees. In some implementations, the phase relationship between the first and the second RF signals provided by the RF power supply 422 can be tunable between 0 and 360. In some implementations, the RF supply 422 can include two individual RF power supplies 422a and 422b that are phase-locked to each other.

In some implementations, the first RF power source drives the first bus 732, and the second bus 742 is connected to an RF ground. In such cases, the second bus 742 and the even group of filaments connected to the second bus 742 can serve as an RF current return path.

In some implementations, the first RF power source drives the first bus 732 at the first end 752, and a second RF power source drives the first bus 732 at the second end 753, and the second bus 742 is connected to an RF ground.

In some implementations, the first RF power source drives the first bus 732, and the second RF power source drives the second bus 742. In such cases, the electrode assembly 702 may work as a predominantly CCP plasma source. The RF current return path may be provided by the chamber body 102, the top electrode 108, the wedge-shaped top electrode 624, or by the workpiece support electrode 116.

Referring to FIG. 7C, an electrode assembly 704 similar to the electrode assembly 600 has a single bus 734. The bus 734 is electrically connected to the both ends of the filaments 710.

In some implementations, the first RF power source drives the first bus 734. The first bus 734 can have a first end 754 and a second end 755, and in some implementations, the first RF power source drives the first bus 734 at the first end 754, and the second RF power source drives the first bus 734 at the second end 755. In such a configuration, the electrode assembly may work as a predominantly CCP plasma source. The RF current return path may be provided by the chamber body 102, the top electrode 108, the wedge-shaped top electrode 624, or by the workpiece support electrode 116.

Standing waves resulting from reflections of RF signals due to imperfect RF impedance matching/termination can also create non-uniformities in RF signal amplitude along the length of the first bus 730. For example, referring to FIG. 7A, an RF signal launched at the first end 750, upon reaching the second end 751, may get reflected back towards the first end 750 due to a lack of impedance matched termination, creating a standing wave along the length of the first bus 730.

Such non-uniformity in RF signal amplitude across the length of the first bus 730 may result in plasma non-uniformity.

In cases where the electrode assembly is driven by two RF signal sources, various factors affects the shape of the generated plasma region. Examples of factors include the frequency and the phase relation of the two RF signals. Referring to FIG. 7B, for example, when the frequency of the first and second RF signals driving the first bus 732 and the second bus 742 is the same and the phase difference is set to 0 degrees ('monopolar', or 'singled-ended'), the plasma region is pushed out from the gaps between the coplanar filaments 710, leading to discontinuity or non-uniformity in some cases where the spacing between the cylindrical shells is small. When the phase difference of the RF signals driving the adjacent coplanar filaments 710 is set to 180 degrees ('differential'), the plasma region is more strongly confined between the coplanar filaments 710. Any phase difference between 0 and 360 degrees can be used to affect the shape of the plasma region.

In general, the grounding of the workpiece support electrode 116 is a factor affecting the shape of the plasma region. Imperfect RF grounding of the electrode 116 in combination with 0 degrees of phase difference between the RF signals driving the adjacent coplanar filaments pushes the plasma region towards the top gap. However, if adjacent coplanar filaments, e.g., coplanar filaments are driven with RF signals that have 180 degrees of phase difference, the resulting plasma distribution is much less sensitive to imperfect RF grounding of the electrode 116. Without being limited to any particular theory, this can be because the RF current is returned through the adjacent electrodes due to the differential nature of the driving signals.

The electrical configurations and characteristics of the foregoing electrode assemblies (e.g., 400, 500, 502, 504, 600, 601, 700, 702, and 704) can be dynamically changed using RF switches coupled to various locations of the electrode assembly in various configurations.

Figure 8A:
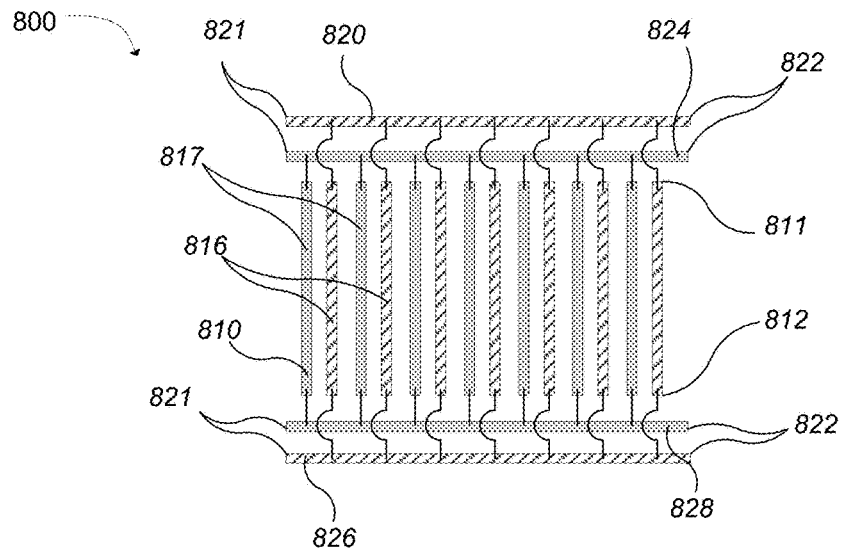
FIG. 8A is a schematic top view diagram of an example of an electrode assembly.

Referring to FIG. 8A, an electrode assembly 800 includes filaments 810, a first bus 820, and a second bus 824. The buses 820 and 824 can have respective third ends 821 and respective fourth ends 822 as shown. The filaments 810 are similar to filaments 610 and 300, except as described. Each filaments 810 has a respective first end 811 and a respective second end 812. The first bus 820 and the second bus 824 can be located inside of the chamber body 102, in the chamber ceiling, or outside of the chamber, and electrical connections can be made between the respective ends of the filaments 810 to various locations along (e.g., along the length of) the buses 820 and 824.

The filaments 810 may be divided into a first multiplicity 816 of filaments and a second multiplicity 817 of filaments. In some implementations, the filaments 810 of the first multiplicity 816 and the second multiplicity 817 can be arranged in an alternating pattern along the direction perpendicular to their longitudinal axis such that the coplanar filaments alternate between the first group and the second group as shown.

The first ends 811 of the filaments of the first multiplicity 816 can be coupled to the first bus 820. The first ends 811 of the filaments of the second multiplicity 817 can be coupled to the second bus 822. The coupling between the filaments 810 and the busses can be achieved using simples wires or metal straps (if the length is short relative to a small fraction of a wavelength at the RF frequency), or by using RF transmission lines, e.g., coaxial cables.

In some implementations, the electrode assembly 800 additional includes a third bus 826 and a fourth bus 828. In such implementations, the second ends 812 of the filaments of the first multiplicity 816 can be coupled to the third bus 824. The second ends 812 of the filaments of the second multiplicity 817 can be coupled to the fourth bus 826.

The buses 820, 824, 826, and 828 are configured electrically couple the respective filaments 810 coupled to it. The RF transmission lines that form the buses may have a length that is comparable to or greater than a significant fraction of a wavelength of the RF frequency (e.g., >$\frac{1}{10}$ wavelength), and are lossy due to deliberate plasma loading of the filament array, i.e., absorption of RF power. Therefore, filaments 810 connected at different locations along the direction of propagation of the RF signal may experience different RF signal amplitude. For example, an RF signal launched at the third end 821 of the first bus 820 will be attenuated as it propagates down the length of the first bus 820. As a result, the RF signal amplitude at the filaments 810 near the second end 822 will be smaller than the RF signal amplitude at the filaments 810 near the first end 821, where the RF signal is being launched. Such non-uniformity in RF signal amplitude across the length of the first buses 820 or 824 may result in plasma non-uniformity.

In general, plasma region generated by the electrode assembly 800 over a substantially large area may contain substantial non-uniformities in plasma densities. For example, for a plasma region that is 40 cm long by 40 cm wide, a substantial difference in plasma uniformity may be observed between RF signal frequency of 13.56 MHz and 60 MHz. When driven at a lower frequency, e.g., 13.56 MHz, the plasma density may decrease towards the central portions of the filaments 810 away from the ends 811 and 812. However, along the direction perpendicular to the longitudinal axis of the filaments, the time—average of the plasma density remain substantially spatially uniform. When driven at a higher frequency, e.g., 60 MHz, the plasma density becomes less uniform both along the filaments and perpendicular to the longitudinal axes of the filaments. For example, periodic distribution of local maxima and minima may form along the two directions. Without wishing to be bound by theory, such patterns of non-uniformities may be caused at least in part by a presence of standing waves.

It may be possible to mitigate such non-uniformities by dynamically changing the electrical characteristics of the electrode assembly 800 using RF switches. It may be also be possible to intentionally introduce non-uniformities in the voltage signal to compensate for other sources of non-uniformity in the workpiece, e.g., non-uniform layer thickness, or the plasma density, e.g., non-uniform gas distribution.

Figure 8B:
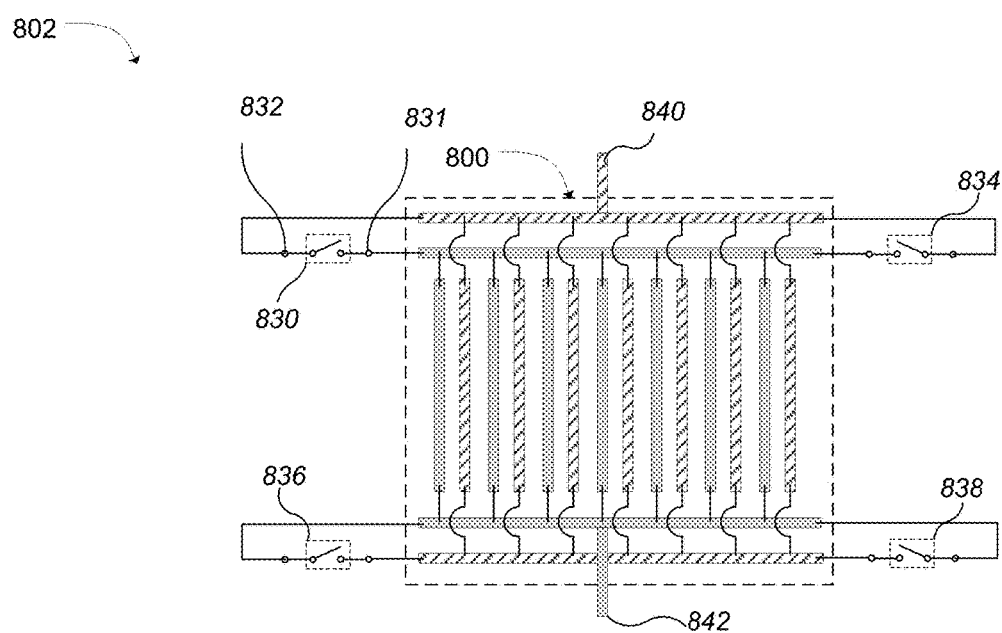
FIGS. 8B-8F are conceptual schematic diagrams of examples of electrical configurations of switched electrode assembly

Referring to FIG. 8B, a switched electrode system 802 includes a first RF switch 830, a second RF switch 834, a third RF switch 836, a fourth RF switch 838, a first tap 840 and a second tap 842. In general, the first and second taps 840 and 842 can be connected to various signals and potentials to generate plasma, e.g., a first and second RF signal, an RF ground.

Each RF switch includes a first terminal 831 and a second terminal 832. In general, the RF switch 830 operates bidirectionally, and first and second end 831 and 832 is not tied to a specific physical terminal of the RF switch, but used rather to refer to the two different terminals of the RF switch. The RF switches 830, 834, 836, and 838 can be provided using various RF switching components. Examples of RF switching components include mechanical relays or switches, PIN diodes, saturable inductor/reactors, MOSFETS, electronic circuits including such components, and frequency-dependent impedance circuits when combined with an RF power generator with tunable RF signal frequency.

In general, the first and second taps 840 and 842 may be located along respective lengths of the buses 820, 824, 826, and 828, e.g., at the middle of the bus. In some implementations, the first tap 840 is located at the middle of the first bus 820, and the second tap 842 is located at the middle of the fourth bus 828.

In some implementations, the first and second taps 840 and 842 are differentially driven by two RF signals having a same frequency (e.g., 60 MHz) and a relative phase difference of 180 degrees.

In general, the first and second terminals 831 and 832 of the RF switches can be coupled to the busses in various ways to achieve various effects. For example, the respective first terminals of the RF switches 830, 834, 836, and 838 are connected to ends of the busses 820, 824, 826, and 828 as shown. In such a configuration, closing of any one of the RF switches 830, 834, 836 and 838 electrically connects, or "shorts", the respective ends of the busses (the "corners"). Shorting of the corners can cause a change in a RF reflection coefficient at that location, resulting in reduced RF signal amplitude and power coupling at a local region of the filaments 810 near the shorted corner, and thus reducing local plasma generation. Shorting of the corners can also move and/or change the spatial distribution of the maxima and minima in plasma density.

In general, electrical connections and couplings can be provided by conductive wires, coaxial cables, waveguides, or by physical contact (e.g., welding, soldering, one-piece fabrication).

In general, process uniformity of the workpiece can be improved by time-averaging of the plasma exposure. One way of achieving time-averaging of the plasma exposure is through moving of the spatial distribution of non-uniformities in the plasma region. For example, by opening and closing of ("modulating") RF switches coupled to the four corners of the electrode assembly, the plasma density distribution (non-uniformities) can be moved around.

The RF switches 830, 834, 836, and 838 can be modulated in various ways to achieve desired time-averaged plasma density. An example of a sequence for modulating the RF switches is to cyclically connect pairs of points on different buses. For example, the system could be operated as follows: (1) close RF switch 830 for a first duration then open, (2) close RF switch 834 for a second duration, then open, (3) close RF switch 836 for a third duration, then open, (4) close RF switch 838 for a fourth duration. The first through fourth duration can be determined based on desired repetition rate of the sequence. Repetition rate can be set, for example, to be substantially faster than timescale of certain effects, e.g., device charging. For example, in a sequence with 4 states, the individual state durations, including dead time, can be set to 50 μs to achieve a repetition rate of 5 kHz.

In some implementations, a dead time between the steps of the sequence is inserted. The dead time may provide a "break before make" contact to prevent shorting of two or more generators in certain configurations. In some implementations, closing of the switches can overlap in time. For example, two switches can be modulated in synchrony, e.g., pairs of diagonally opposed switches (830-838, 834-836), pairs of adjacent switches (830-834 and 836-838, 832-836 and 834-838). As another example, all four switches can be opened and closed in synchrony.

Figure 8C:
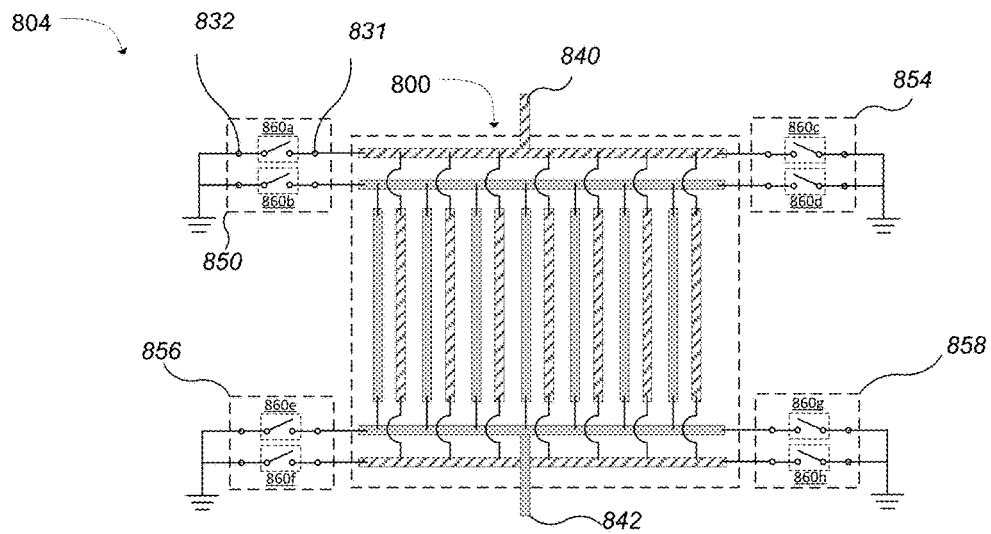

Referring to FIG. 8C, an example of a switched electrode system 804 is shown. The switched electrode system 804 is similar to system 802, except as described. The switched electrode system 804 includes a first group of RF switches 850, a second group of RF switches 854, a third group of RF switches 856, and a fourth group of RF switches 858. The first group of RF switches 850 includes sub-switches 860*a* and 860*b*, the second group of RF switches 854 includes sub-switches 860*c* and 860*d*, the third group of RF switches 836 includes sub-switches 860*e* and 860*f*, and the fourth group of RF switches 838 includes sub-switches 860*g* and 860*h*. The sub-switches are similar to RF switch 830.

The first terminals 831 of the sub-switches are connected to ends of the busses 820, 824, 826, and 828. In some implementations, the second terminals 832 of the sub-switches are connected to an RF ground. In such a configuration, closing of any one of the sub-switches electrically connects the respective ends of the busses to the RF ground, or grounds the ends of the busses. Grounding of an end of a bus can lead to reduced RF signal amplitude in a local region of the filaments 810 near the RF grounded end of the bus, and results in a reduced squared amplitude of the electric field in that region, or lower power coupling. A reduced squared amplitude of the electric field can lead to reduced plasma generation in that region.

The groups of RF switches and individual sub-switches can be modulated in various ways to provide modulation of plasma density distribution. For example, each group of RF switches can be operated as a single unit in which the sub-switches of the group of RF switches are opened and closed as a single unit. As another example, the sub-switches of each group of RF switches can be independently opened and closed.

Switches can be modulated in various different sequences in manners similar to various sequences described in relation to FIG. 8B. For example the switched electrode system can be operated by cyclically closing one group of switches at a time (optionally with a time delay), cyclically closing groups of switches with overlap in times that the different groups are closed, alternating groups of switches, or opening and closing all switches in synchronicity.

As another example, the system could be operated as follows: (1) close first and third group of RF switches 850 and 856 for a first duration then open, (2) open all switches, (3) close second and fourth group of RF switches 854 and 858 for a second duration then open.

As yet another example, the system could be operated as follows: (1) close first group of switches 850 for a first duration then open, (2) close second group of switches 854 for a second duration then open, (3) close third group of switches 856 for a third duration then open, (4) close fourth group of switches 858 for a fourth duration then open, (5) open all group of switches, (6) close all group of switches.

Figure 8D:
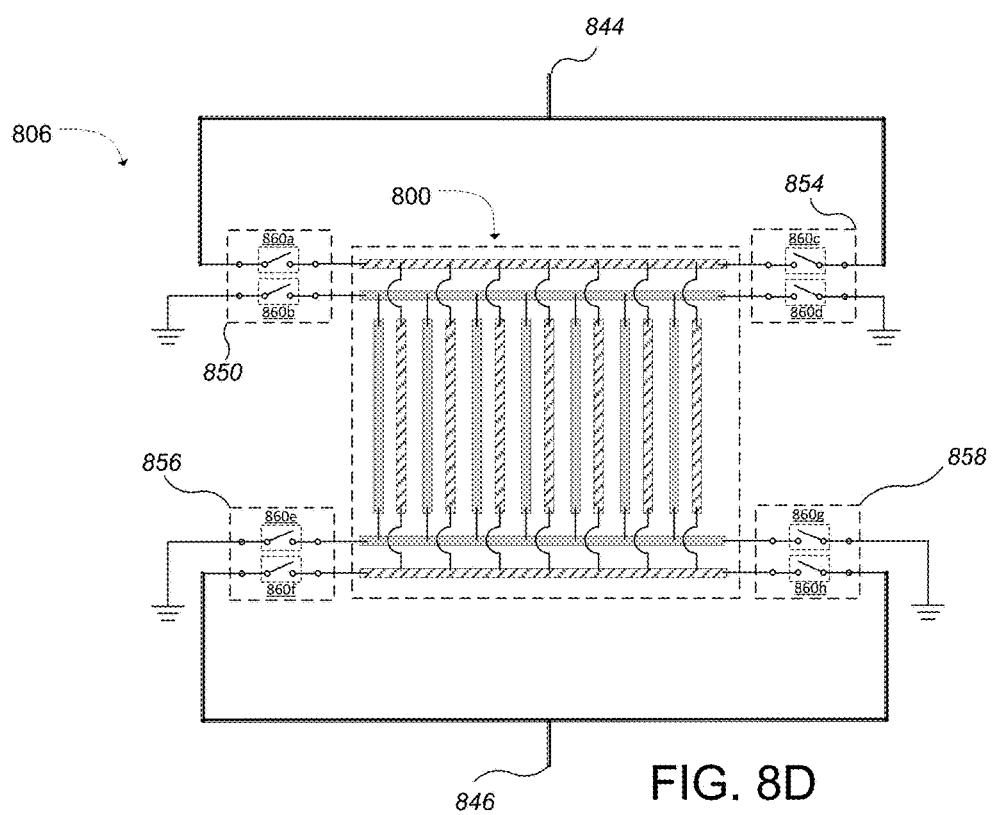

In some implementations, the feeding of the RF signal to various locations on the bus can be dynamically reconfigured using RF switches. Referring to FIG. 8D, an example of a switched electrode system 806 is shown. The switched electrode system 806 is similar to system 804 and can be operated in a similar manner, except as described.

The first multiplicity 816 is driven with an RF signal at taps 844 and 846. The RF signals driving the taps 844 and 846 can be at the same frequency or at a different frequency. For cases when the frequency is the same, the phase relationship of the two signals can be 0, 180, or any value between 0 and 360. For some implementations, the phase relationship can be modulated over time. The second terminals 832 of the sub-switches 860*a*, 860*c*, 860*f*, and 860*h* are connected to the respective taps 844 and 846 as shown.

In such a configuration, the grounding characteristics of the second multiplicity 817 can be modulated using the respective sub-switches, and RF signals can be launched in to the buses 820 and 826 from different locations, such as from ends 821 and 822. The combination of modulation of grounding characteristics and RF signal distribution can be used to modulate the plasma density to improve processing uniformity by time-averaging.

In such a configuration, it may be advantageous to maintain at least one of the sub-switches 860 in a closed state to provide a continuous supply of RF signal to the assembly 800.

Figure 8E:
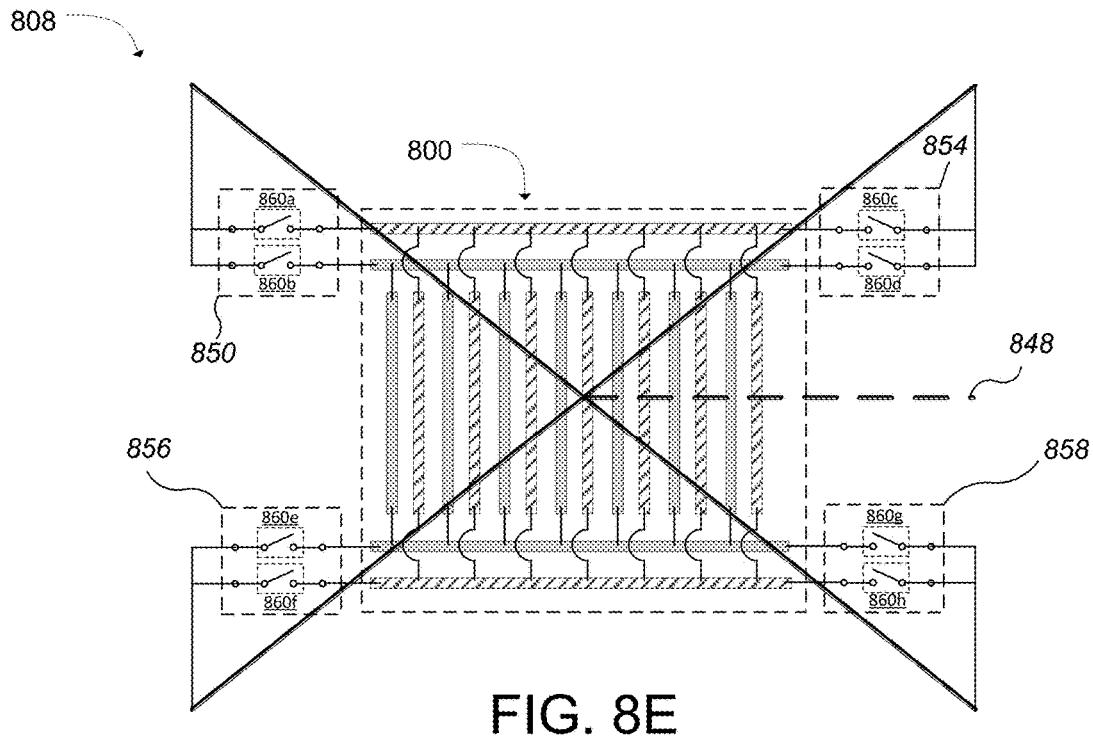

Referring to FIG. 8E, an example of a switched electrode system 808 is shown. The switched electrode system 808 is similar to system 804 and can be operated in a similar manner, except as described. The second terminals 832 of the sub-switches are connected to a single tap 848. A symmetric distribution network as shown can be used to improve uniformity of the RF signal delivered to the four corners of the system 808. The sub-switches can be modulated in various ways a previously described to change plasma distribution and improve process uniformity.

Figure 8F:
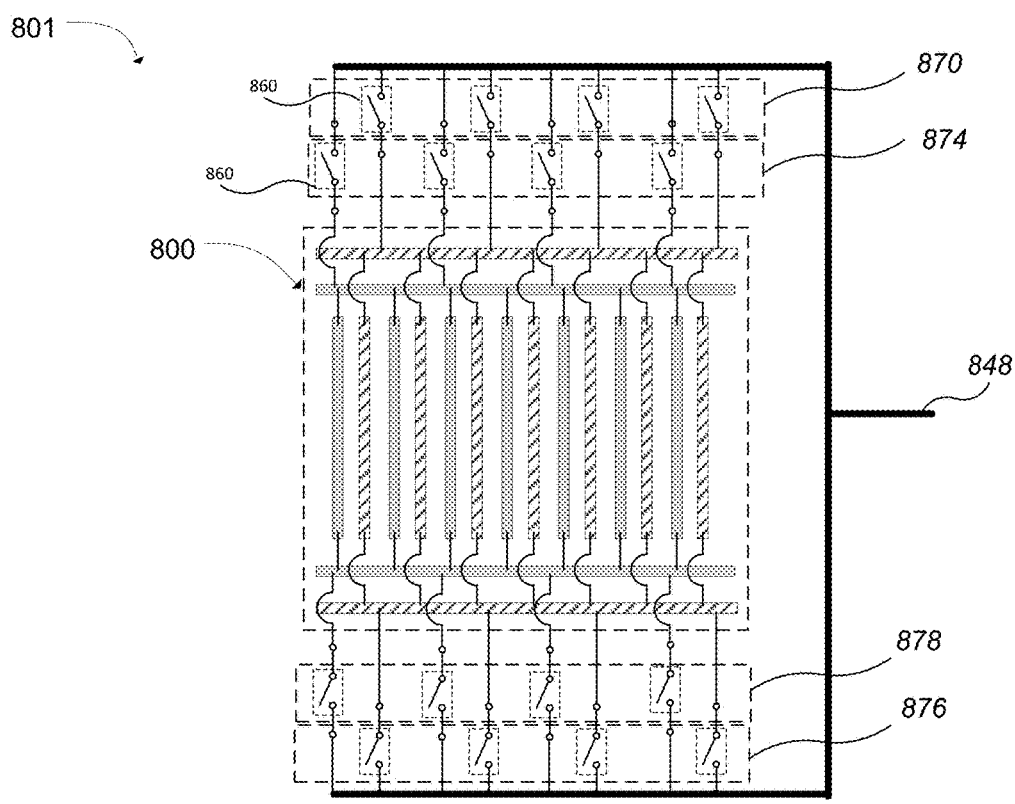

In some implementations, the switches can distributed across buses to allow finer control of instantaneous plasma uniformity and thereby improved time average plasma uniformity. Referring to FIG. 8F, an example of a switched electrode system 801 is shown. The switched electrode system 801 is similar to system 808 and can be operated in a similar manner, except as described. The first bus 820 is coupled to a first group of RF switches 870, e.g., three or more sub-switches. Each group of RF switches includes multiple sub-switches 860. The first terminals of the sub-switches 860 of the first group of RF switches 870 are electrically coupled to the first bus at various locations across the length of the first bus 820. In some implementations, the coupling points are approximately equally spaced as shown. The second terminals of the sub-switches 860 of the first group of RF switches 870 are electrically coupled to the tap 848 to receive the RF signal.

The second, third, and fourth buses 824, 826 and 828 are connected to a second, third, and fourth group of RF switches 874, 876, and 878, respectively, each in a manner similar to the first bus 820 and first group of RF switches 870 as shown.

In such a configuration, the additional level of control over the launching locations of the RF signals along the lengths of the busses can lead to improved time-averaged plasma uniformity.

In general, the number of sub-switches included in a group of RF switches can be determined based on, for example, the lengths of the buses, size of the plasma region, RF signal frequency and power, and chamber pressure.

Figure 9A:
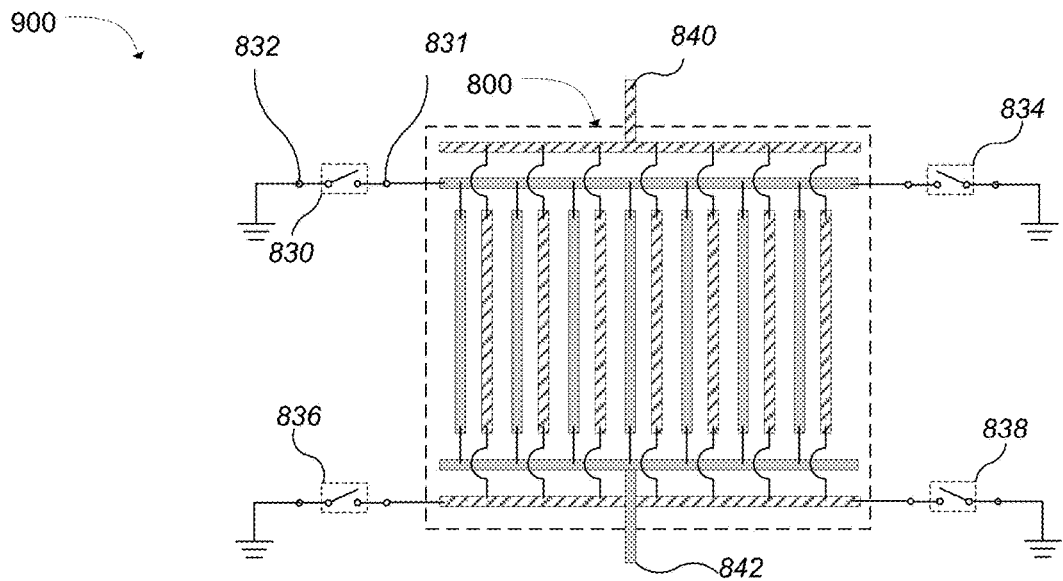
FIGS. 9A-9B are conceptual schematic diagrams of examples of a mode-selectable switched electrode systems.

In some implementations, the RF signal feeding and grounding location can be dynamically reconfigured using RF switches to provide a mode-selectable plasma source that can switch between a predominantly CCP mode and predominantly ICP mode. Referring to FIG. 9A, an example of a switched electrode system 900 is shown. The switched electrode system 900 is similar to the system 802 and can be operated in a similar manner, except as described. The first terminals 831 of the RF switches 830 and 834 are connected to the respective third end 821 and fourth end 822 of the second bus 824, and the first terminals 831 of the RF switches 836 and 838 are connected to the respective third end 821 and fourth end 822 of the third bus 826 as shown. The second terminals 832 are connected to an RF ground.

The RF switches 830, 834, 836, and 838 can be controlled in various ways to change the dominant mode of plasma generation by the switched electrode assembly 900. For example, by closing all four RF switches, RF current flows along the lengths of the filaments 810, creating magnetic fields and producing a predominantly inductively coupled plasma. By opening all four switches, RF current flow is reduced, and the assembly 900 creates a predominantly capacitively coupled plasma.

In some implementations, the first and second RF signals driving the respective taps 840 and 842 have a phase difference of 180 degrees, i.e., differentially driven. In such cases, alternating filaments 810 belonging to the first and second multiplicity 816 and 817 are fed from opposite ends with RF signals having approximately 180 degrees of phase difference, resulting in generation of aiding RF magnetic fields. In some implementations, the first and second RF signals driving the respective taps 840 and 842 have a phase difference of approximately 0 degrees. In such cases, alternating filaments 810 belonging to the first and second multiplicity 816 and 817 are fed from opposite ends with RF signals having approximately 0 degrees of phase difference, resulting in generation of opposing RF magnetic fields.

Figure 9B:
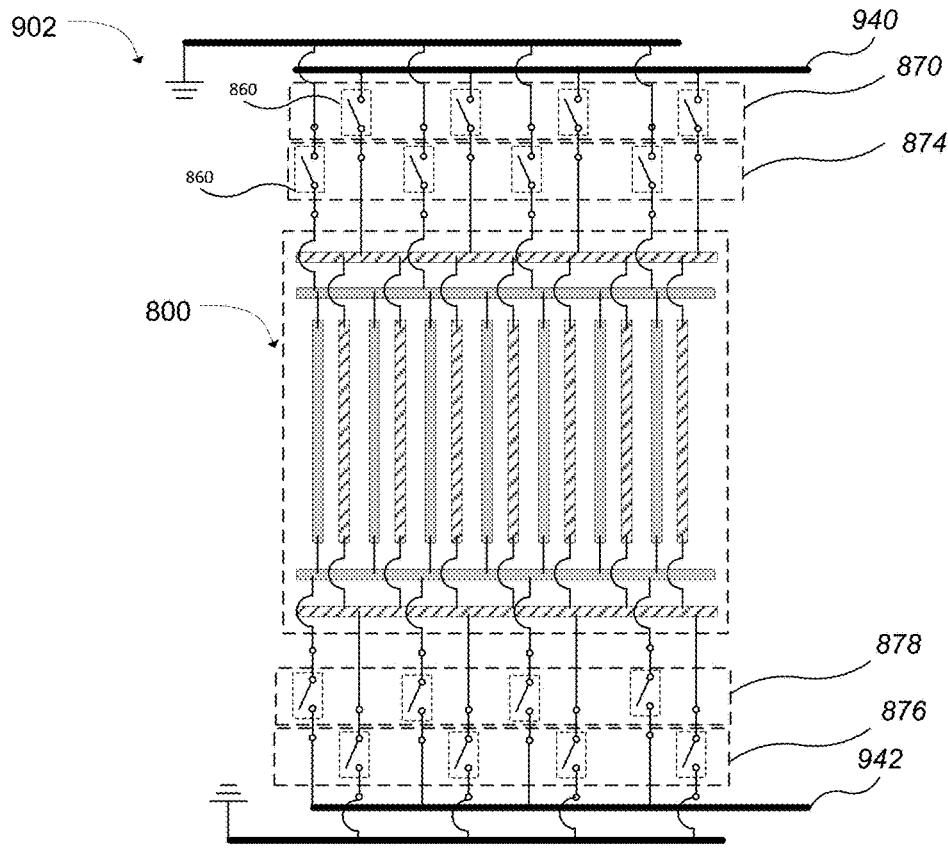

In some implementations, the switches can distributed across buses to allow finer control of instantaneous plasma uniformity and thereby improved time average plasma uniformity. Referring to FIG. 9B, an example of a switched electrode assembly 901 is shown. The switched electrode assembly 902 is similar to system 801, except as described. The first bus 820 is coupled to a first group of RF switches 870 that includes multiple sub-switches 860.

The first terminals of the sub-switches 860 of the first group of RF switches 870 are electrically coupled to the first bus at various locations across the length of the first bus 820. In some implementations, the coupling points are approximately equally spaced as shown. The second terminals of the sub-switches 860 of the first group of RF switches 870 are electrically coupled to the tap 940 to receive a first RF signal.

The second bus is connected to the second group of RF switches 874 at the first terminals of the sub-switches, and the second terminals of the sub-switches are connected to an RF ground.

The third bus is connected to the third group of RF switches 876 at the first terminals of the sub-switches 860, and the second terminals 832 of the sub-switches 860 of the third group of RF switches 876 are connected to an RF ground.

The fourth bus is connected to the fourth group of RF switches 878 at the first terminals of the sub-switches, and the second terminals of the sub-switches are electrically coupled to the tap 942 to receive a second RF signal.

The first and second RF signals driving the taps 940 and 942 can be at the same frequency or at a different frequency. For cases when the frequency is the same, the phase relationship of the two signals can be 0, 180, or any value between 0 and 360. For some implementations, the phase relationship can be modulated over time.

The groups of RF switches 870, 874, 876, and 878 can be controlled in various ways to change the dominant mode of plasma generation by the switched electrode assembly 901. For example, by closing at least one of the sub-switches from each of the first group 870 and the fourth group 878, and opening the second and third groups of RF switches 874 and 876, the assembly 901 creates a predominantly capacitively coupled plasma.

As another example, by closing at least one of the sub-switches from each of the first group 870 and the fourth group 878, and closing all sub-switches of the second and third groups of RF switches 874 and 876, the assembly 901 creates a predominantly inductively coupled plasma. In some implementations, the first and second RF signals driving the respective taps 940 and 942 have a phase difference of 180 degrees, i.e., differentially driven. In such cases, alternating filaments 810 belonging to the first and second multiplicity 816 and 817 are fed from opposite ends with RF signals having approximately 180 degrees of phase difference, resulting in generation of aiding RF magnetic fields. In some implementations, the first and second RF signals driving the respective taps 940 and 942 have a phase difference of approximately 0 degrees. In such cases, alternating filaments 810 belonging to the first and second multiplicity 816 and 817 are fed from opposite ends with RF signals having approximately 0 degrees of phase difference, resulting in generation of opposing RF magnetic fields.

In some processing applications, ICP generation using opposing RF magnetic field which can deposit RF power into plasma in strips generally parallel to the filaments, may provide a more uniform plasma, particularly when the workpiece is close to the plasma source (e.g., electrode assembly), i.e., small bottom gap 132. Therefore, having the capability of changing the phase relationship of the first and second RF signal may be beneficial.

In general, the individual sub-switches of the first and fourth group 870 and 878 can be modulated to vary the plasma density distribution. In addition, in cases where the switched electrode assembly 901 is configured to create predominantly inductively coupled plasma, the sub-switches of the second and third group 874 and 876 can be individually modulated to further modify the plasma density distribution.

In general, while figures shows buses driven near center and ends floating or with ground terminations, depending on application, RF configuration, frequency and operating region (plasma load) it may be advantageous to drive or terminate at other locations e.g. driven ends, terminate ends or center.

In general, in cases where the second terminals of RF switches are connected to an RF ground, a variable impedance can be placed in series to the RF ground to provide a variable RF termination impedance to further control the modification of plasma density.

In general, while figures illustrated taps connected to the center of the respective buses, the taps for applying RF power to the electrode assembly could be located at one or more ends, the center, or other positions on the bus.

Figure 10:
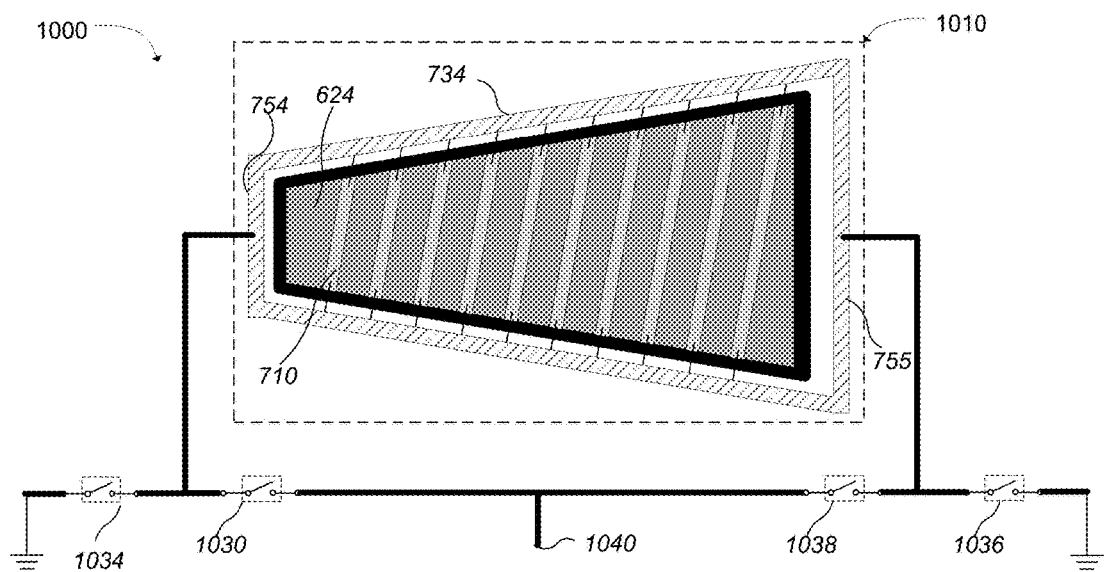
FIG. 10 is a conceptual schematic diagram of an example of a switched wedge-shaped electrode system.

Switches can be used to improve time-averaged plasma uniformity of a wedge-shaped electrode assembly. Referring to FIG. 10, an example of a switched electrode assembly 1000 is shown. The switched electrode assembly 1000 includes the wedge-shaped electrode assembly 1010. The wedge-shaped electrode assembly 1010 is similar to wedge-shaped electrode assembly 704, except as described. The assembly 1010 includes wedge-shaped top electrode 624, which can be grounded. The switched electrode assembly 1000 includes a first RF switch 1030, a second RF switch 1034, a third RF switch 1036, a fourth RF switch 1038, and a tap 1040. The RF switches are similar to RF switch 830. The first terminals of RF switches 1030 and 1034 are connected to the first end 754 of the assembly 1010, and the first terminals of RF switches 1036 and 1038 are connected to the second end 755 of the assembly 1010. The second terminals of first and fourth RF switches 1030 and 1038 are connected to each other and to a tap 1040, and the second terminals of the second and the third RF switches 1034 and 1036 are connected to an RF ground.

The first and fourth RF switches 1030 and 1038 can be opened and closed to selectively feed RF signal to the first end 754, the second end 755, or both ends of the assembly 1010. The second and third RF switches 1034 and 1036 can be opened and closed to selectively ground the first end 754 or the second end 755 of the assembly 1010.

The RF switches can be modulated in various ways to improve time-averaged plasma uniformity. Following is an example of a sequence: (1) close RF switch 1030 for a first duration, and open switches 1034, 1036 and 1038 (e.g., for 30 microseconds), (2) close 1030, 1036, open 1034, 1038 (e.g., for 40 microseconds), then (3) close 1036, open 1030, 1034, and 1036 (e.g., for 30 microseconds). Optionally either unpowered end may be grounded after a short delay after applying RF signal to the other end, and the grounded end may be ungrounded prior to applying RF signal to that end.

Following is another example of a sequence: (1) 1030=ON, 1038, 1034, 1036=OFF for 30 microseconds, (2) 1030, 1038=ON, 1034, 1036=OFF for 40 microseconds, (3) 1038=ON, 1034, 1030, 1036=OFF for 30 microseconds, then the cycle is repeated multiple times until the process step is completed or alternately reversed cyclically. Optionally either unpowered end may be grounded after a short delay after applying power to the other end, and the grounded end may be ungrounded prior to applying power to that end In general, a wedge-shaped electrode assembly 1010 similar to 704 was described, in general, the switches can be applied to other electrode assemblies, e.g., 600, 601, 700, 702, 704.

RF switches suitable for switching RF signals for plasma generation can be provided using various circuit implementations. Various considerations exist for implementing RF switches (e.g., RF switch 830, sub-switch 860) to be used in switched electrode systems. Examples of such considerations include RF power handling capacity, switching speed, ON-state impedance, OFF-state impedance, and bidirectionality.

In general, a switch is considered to be in an "ON", or closed, state when the impedance presented between the two terminals of the switch is low, and in an "OFF", or open, state when the impedance is high.

Figure 11A:
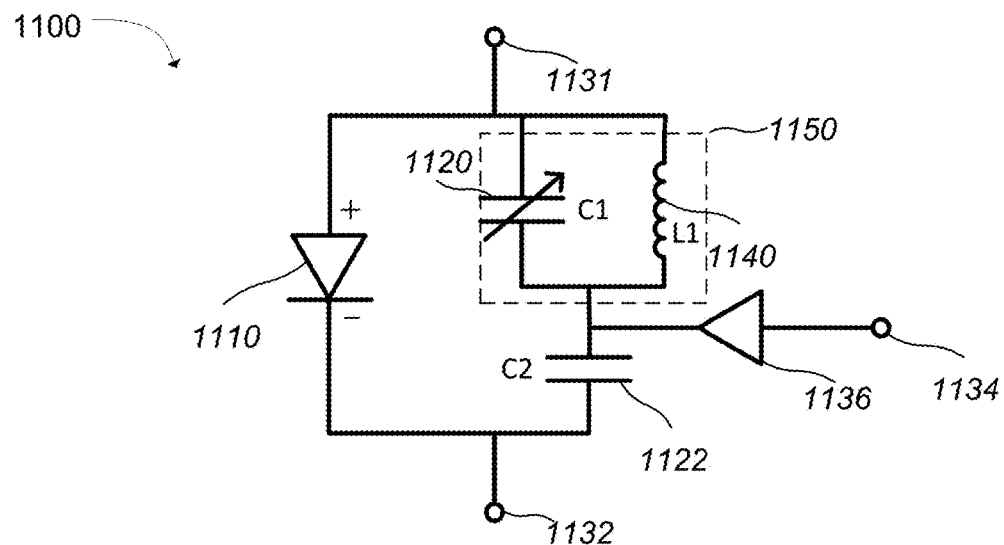
FIG. 11A is a schematic diagram of an example of a PIN diode switch.

A PIN diode switch may be used to provide a suitable RF switch. Referring to FIG. 11A, a PIN diode switch 1100 includes a PIN diode 1110, a first capacitor 1120 having capacitance C1, a second capacitor 1122 having capacitance C2, and an inductor 1140 having inductance L1. The switch 1100 has a first terminal 1131, a second terminal 1132, and a control terminal 1134. The first terminal 1131 can provide the first terminal 831, and the second terminal 1132 can provide the second terminal 832 of the RF switch 830.

The first capacitor 1120 and inductor 1150 can be connected in parallel between the first terminal 1131 and the second capacitor 1122. Then the PIN diode 1110 can be connected in parallel with the first capacitor 1120, inductor 1150 and second capacitor 1122 between the first terminal 1131 and the second terminal 1132. The control terminal 1134 can be connected between the second capacitor and 1122 and the first capacitor 1120.

The PIN diode 1110 is a diode with a wide, undoped intrinsic semiconductor region between a p-type semiconductor and an n-type semiconductor region, and can be well suited for fast switching of high power RF signals. The PIN diode has an anode (+) and a cathode (−), and can provide a low impedance conduction path, e.g., <1 ohm, for RF signals when a forward bias is established between the anode and the cathode (e.g., >0.7 V and/or diode current >100 mA).

The PIN diode switch 1100 operates based on the following working principle. The impedance of the PIN diode 1110 can be controlled by providing a control signal to the control terminal 1134. The control signal is a quasi-static voltage switching between a first level (e.g., 0.7 V), and a second level (e.g., −2 kV). Due to the quasi-static nature of the control signal, the control voltage and any resulting diode current can conduct through the inductor 1140. Additionally, the second capacitor 1122 blocks the control voltage from reaching the cathode. By providing a sufficiently large negative control voltage (e.g., −2 kV) to the anode with respect to the cathode, the PIN diode 1110 can be set to an "OFF" state, presenting a high impedance across its cathode and anode. When a sufficiently large positive control voltage (e.g., 0.7 V) is applied, the PIN diode 1110 can be set to an "ON" state, presenting a low impedance path (e.g., <1 ohm) for the RF signal between the terminals 1131 and 1132.

The first capacitor 1120 and the inductor 1140 connected in parallel as shown form a parallel LC resonator 1150. The resonator 1150 has a resonance frequency determined by the equation $f_0 = 1/2\pi\sqrt{L1 * C1}$. At the resonance frequency $f_0$, the resonator 1150 presents a high impedance approximating an open circuit (e.g., >1000 ohms), depending on the quality factor of the resonator. By selecting the values for C1 and L1 such that the resonance frequency aligns with the frequency of the RF signal present at the terminals 1131 or 1132, the RF signal can be prevented from passing through the resonator 1150.

In general, the capacitance C2 of the second capacitor 1122 can be set to provide a low impedance path at the frequency of the RF signal.

In some implementations, the first capacitor 1120 is a variable capacitor ("a varactor") with tunable capacitance C1 that can be varied to optimize the resonance of the parallel LC circuit formed by the first capacitor 1120 and the inductor 1140 to align with the frequency of the RF signal.

In some implementations, a control signal buffer amplifier 1136 can be provided to buffer and/or amplify the control signal applied at the control terminal 1134 to the anode of the PIN diode 1110.

In general, multiple PIN diode switches may be used in combination to achieve a range of impedance values between the first and the second terminals 1131 and 1132. The control signal may also be set between the first and second level to provide a variable impedance.

In some implementations, the first terminal 1131 is connected to a bus (e.g., bus 820), and the second terminal 1132 is connected to an RF ground, forming a path to the RF ground. In some implementations, the first terminal is connected to a first bus (e.g., bus 820) and the second terminal 1132 is connected to a second bus (e.g., bus 824), in which case the switch may be considered to be "floating", the potential of the second terminal 1132 defined by external factors.

Figure 11B:
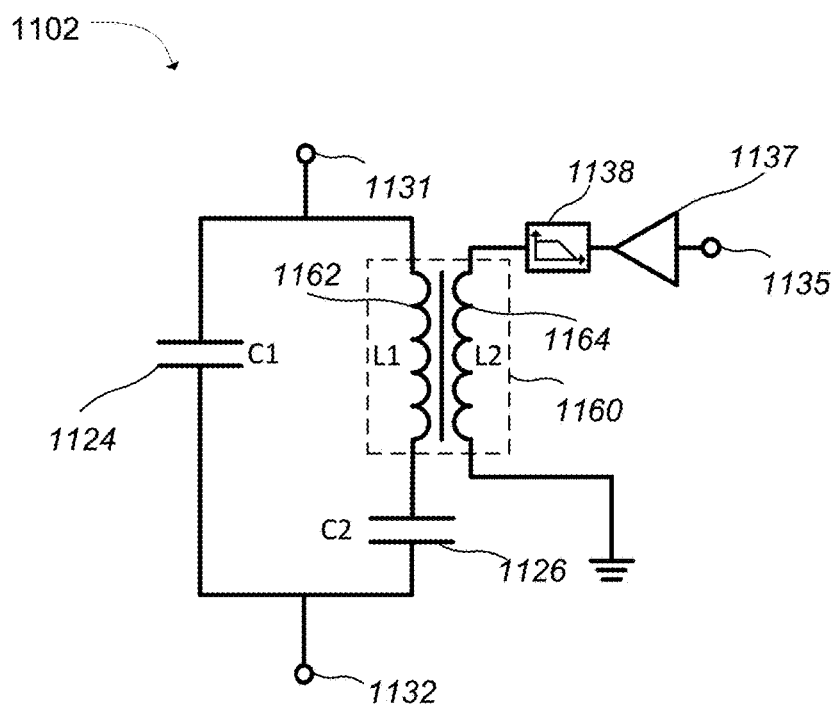
FIG. 11B is a schematic diagram of an example of a saturable inductor switch.

As another example, a saturable inductor switch may be used to provide a suitable RF switch. Referring to FIG. 11B, a saturable inductor switch 1102 includes a saturable inductor 1160, a first capacitor 1124 having capacitance C1, and a second capacitor 1126 having capacitance C2. The switch 1102 has a first terminal 1131, a second terminal 1132, and a control terminal 1135. The first terminal 1131 can provide the first terminal 831, and the second terminal 1132 can provide the second terminal 832.

The saturable inductor 1160 has a primary winding 1162 having inductance L1, and a control winding 1164 having inductance L2. The saturable inductor may also be called a saturable reactor or a magnetic amplifier in some literatures. A saturable inductor is a type of inductor having a magnetic core that can be deliberately saturated by a current flowing through the control winding 1164. Once saturated, the primary winding 1162 experiences a substantial drop in its inductance L1. The decreased inductance of the primary windings leads to reduction of impedance presented to the RF signal, which can be used to achieve switching.

The primary winding 1162 of the inductor 1160 can be connected in series with the second capacitor 1126, and the first capacitor 1124 can be connected in parallel with the primary winding 1162 and second capacitor 1126 between the first terminal 1131 and the second terminal 1131. The control terminal 1135 is connected to the control winding 1164, which can be connected in turn to ground.

The saturable inductor switch 1102 operates based on the following working principle. The first capacitor 1124 in parallel with a series combination of the primary winding 1162 and the second capacitor 1126 form a parallel LC resonator that operates similarly to the LC resonator 1150. For example, the values for C1, C2, and L1 can be set such that the resonance of the switch 1102 occurs at the RF signal frequency, e.g., 60 MHz, when the control signal is set to an "OFF", or low, state in which there is no current flowing through the control winding 1164. In such a state, the switch 1102 is in an "open" state, presenting a high impedance between the first and second terminals 1131 and 1132. When the control signal applied to the control terminal 1135 is set to an "ON", or high, state, the magnetic field generated by the current flowing through the secondary winding 1164 saturates the magnetic core of the saturable inductor 1160, reducing the inductance L1 of the primary winding 1162. The reduction of inductance L1 modifies the resonance frequency of the switch 1102, presenting a low impedance between the first and second terminal 1131 and 1132 at the same RF signal frequency. This low impedance state can be used as a closed state of the switch 1102.

In some implementations, a control signal buffer amplifier 1137 can be provided to amplify and/or buffer the control signal applied at the control terminal 1135 so that a current sufficient to saturate the saturable inductor 1160 can be applied to the control winding 1164.

In some implementations, a low pass filter 1138 can be provided between the control signal terminal 1135 and the control winding 1164 to mitigate noise coupling from the control signal and/or RF signal propagating towards the control signal terminal.

In general, the impedance of the switch presented between the first terminal 1131 and the second terminal 1132 can be controlled between the "ON" state and the "OFF" state by adjusting the control signal to provide a range of current to the control winding 1164.

In some implementations, the first terminal 1131 is connected to a bus (e.g., bus 820), and the second terminal 1132 is connected to an RF ground. In some implementations, the first terminal is connected to a first bus (e.g., bus 820) and the second terminal 1132 is connected to a second bus (e.g., bus 824).

The impedance, and therefore the switching state, presented by the foregoing switches 1100 and 1102 are controlled by an application of a control signal. However, in some implementations, the characteristics of a switch can remain static, and instead the frequency of the RF signal can be modulated so that a switch presents an "open" or "closed" state to RF signals having different frequencies. For example, a frequency dependent impedance of a circuit can be used to provide such a frequency-based switch.

Figure 12A:
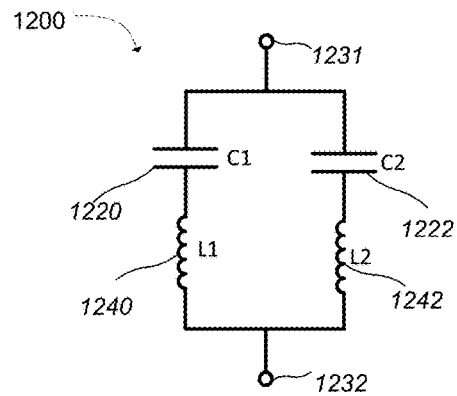
FIG. 12A is a schematic diagram of an example of a frequency-based switch.

Referring to FIG. 12A, a frequency-based switch 1200 includes a first capacitor 1220 having capacitance C1, a second capacitor 1222 having capacitance C2, a first inductor 1240 having inductance L1, and a second inductor 1242 having inductance L2. The switch 1200 has a first terminal 1231, and a second terminal 1232.

The first capacitor 1220 and the first inductor 1240 can be connected in series, and the second capacitor 1222 and the second inductor 1242 can be connected in series. This pair of circuits can be connected in parallel between the first terminal 1231 and the second terminal 1232.

The combination of L1, C1, L2, and C2 can be set such that at a first frequency, e.g., 58 MHz, a low impedance (e.g., <0.1 ohm) is presented between the first and second terminals 1231 and 1232, and at a second frequency, e.g., 62 MHz, a high impedance (e.g., >100 ohm) is presented. For example, the following values of L1=L2=0.1 µH, C1=75.3 pF, C2=58.6 pF can provide a low impedance resonance at 58 MHz, and a high impedance resonance at 62 MHz.

Without wishing to be bound by theory, the low impedance resonance may be provided by a series LC resonance and the high impedance resonance may be provided by a parallel LC resonance.

The capacitances and inductances can be set to form a frequency-based switch that has an approximately complementary response to the example provided above. For example, the following values of L1=L2=0.1 µH, C1=65.9 pF, C2=87.8 pF can provide a low impedance resonance at 62 MHz, and a high impedance resonance at 58 MHz, presenting an approximately complementary, or opposite, response relative to the first example. Such complementary behavior can be used to form various frequency-switched electrode systems.

In some implementations, the discrete capacitors and inductors can be implemented with distributed circuit elements, e.g. transmission line segments, stubs.

Figure 12B:
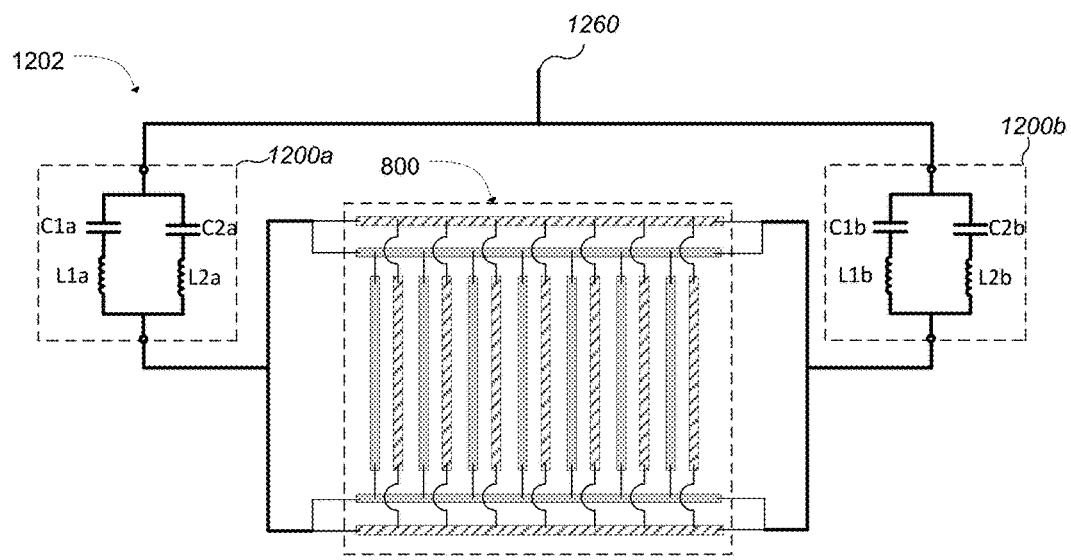
FIGS. 12B-C are conceptual schematic diagrams of examples of electrical configurations of frequency-switched electrode systems.

Referring to FIG. 12B, a frequency-switched electrode system 1202 includes an electrode assembly 800, a first frequency-based switch 1200a, a second frequency-based switch 1200b, and a tap 1260. RF signals of different frequencies can be provided to the tap 1260, for example, using a variable-frequency RF generator with a matching network and isolator or circulator in series.

In this configuration, the frequency of the RF signal supplied through the tap 1260 can alternate from a first frequency to a second frequency to cause more RF signal to couple to the left side of the electrode assembly 800 through the switch 1200a, or to the right side of the electrode assembly 800 through the switch 1200b. Alternatively, the frequency of the RF signal supplied through the tap 1260 can be driven, e.g., with a ramp function, to vary between a first frequency and a second frequency.

For example, by setting the components values to L1a=L2a=0.1 µH, C1a=75.3 pF, C2a=58.6 pF, the first switch 1200a can provide a low impedance resonance at 58 MHz, and a high impedance resonance at 62 MHz. The component values of the second switch 1200b can be set to L1=L2=0.1 µH, C1=65.9 pF, C2=87.8 pF to provide a low impedance resonance at 62 MHz, and a high impedance resonance at 58 MHz. In such a configuration, by switching the frequency of the RF signal to the first frequency, e.g., 58 MHz, a majority of RF signal can be coupled to the left side of the electrode assembly 800 through the first switch 1200a, and by switching the frequency of the RF signal to the second frequency, e.g., 62 MHz, the majority of RF signal can be coupled to the right side of the assembly 800 through the second switch 1200b. When frequency is mid-way in between the two frequencies, broadly around 60 MHz, then power is coupled approximately similarly to both ends and a high center non-uniformity may result.

In some implementations, the frequency dependent impedance of the switch 1200 can be modified using a transmission line segment. For example, a transmission line segment that is a quarter-wavelength in length, accounting for the velocity factor of the transmission line, can be used to connect the corners of the electrode assembly 800 to the terminal of the switches 1200a and 1200b. By using a quarter-wavelength transmission line, the presented impedance at the first and second frequencies may be swapped. For example, the low impedance at the series resonance may be transformed to a high impedance of about 1000 ohms, and the high impedance at the parallel resonance may be transformed to a low impedance of about 1 ohm.

Figure 12C:
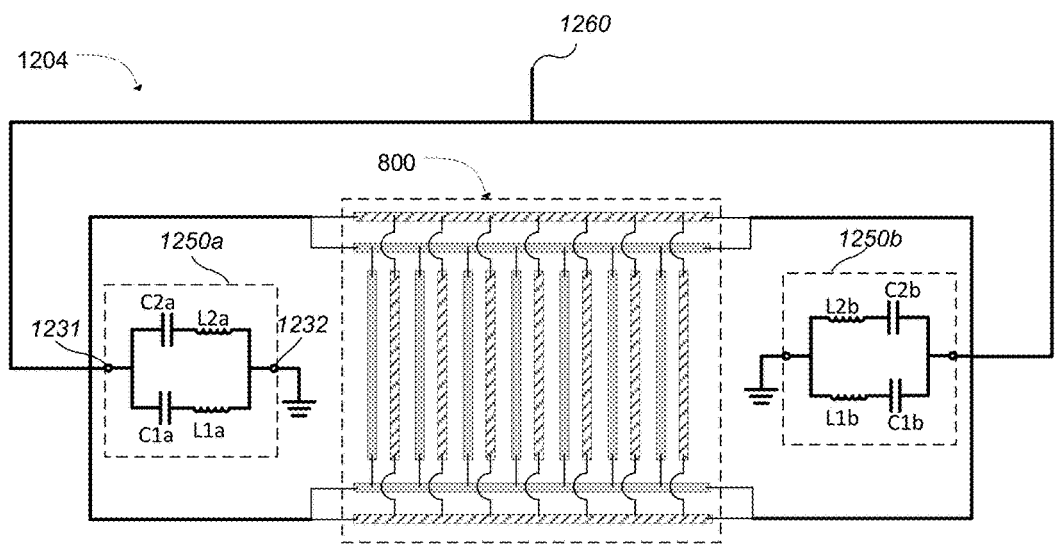

In some implementations, the frequency-based switch 1200 can be used as a frequency-selective termination to provide impedance-matched termination at different frequencies to control coupling of the RF signal into the electrode assembly. Referring to FIG. 12C, a frequency-switched electrode system 1204 includes an electrode assembly 800, a first frequency-selective termination 1250a, a second frequency-selective termination 1250b, and a tap 1260. The frequency selective terminations 1250a and 1250b can be provided by the frequency-based switch 1200, and operated in a similar manner, except as described.

In some implementations, the component values of the frequency-selective terminations 1250a and 1250b can be set such that at the first frequency, termination 1250a presents a characteristic impedance of the RF generator and the transmission line, while the termination 1250b presents a high impedance. In such a configuration, termination 1250a provides an impedance-matched termination to an RF ground, minimizing RF signal reflection and RF signal coupling to the left side of the electrode assembly 800. At the same time, the high impedance presented by the termination 1200b allows the RF signal to be coupled into the right side of the electrode assembly 800.

In some implementations, the component values of the frequency-selective terminations 1250a and 1250b can be set such that at the first frequency, termination 1250a presents a low impedance path to an RF ground while the termination 1250b presents a high impedance. In such a configuration, the low impedance path to the RF ground provided by termination 1250a minimizes RF signal coupling to the left side of the electrode assembly 800. At the same time, the high impedance presented by the termination 1200b allows the RF signal to be coupled into the right side of the electrode assembly 800.

In general, frequency-based switches and frequency-selective terminations can be coupled to various locations along the busses. For example, an additional pair of coupling points to the tap may be provided at approximately the center of the busses, and additional switches or terminations can be provided at those coupling points.

In general, the frequency switching is not limited to the 2 states corresponding to high and low impedance states, but may advantageously be operated continuously between, or beyond the first and second switching frequencies.

In general, various combination of frequency-based switches having various resonance frequencies can be used to expand the frequency-based switching to 3, 4, or more frequencies.

Particular embodiments of the invention have been described. Other embodiments are within the scope of the following claims.

What is claimed is:

1. A plasma reactor comprising:
a chamber body having an interior space that provides a plasma chamber;
a gas distributor to deliver a processing gas to the plasma chamber;
a pump coupled to the plasma chamber to evacuate the chamber;
a workpiece support to hold a workpiece;
an intra-chamber electrode assembly comprising a plurality of filaments extending laterally through the plasma chamber between a ceiling of the plasma chamber and the workpiece support, each filament including a conductor surrounded by a cylindrical insulating shell, wherein the plurality of filaments includes a first multiplicity of filaments and a second multiplicity of filaments arranged in an alternating pattern with the first multiplicity of filaments,
a first bus coupled to the first multiplicity of filaments and a second bus coupled to the second multiplicity of filaments;
an RF power source to apply an RF signal the intra-chamber electrode assembly; and
at least one RF switch configured to controllably electrically couple and decouple the first bus from one of i) ground, ii) the RF power source, or iii) the second bus.

2. The plasma reactor of claim 1, wherein the at least one RF switch comprises a plurality of RF switches connected in parallel between the first bus and the one of the one of i) ground, ii) the RF power source, or iii) the second bus.

3. The plasma reactor of claim 1, wherein the at least one RF switch is configured to controllably electrically couple and decouple the first bus from the second bus.

4. The plasma reactor of claim 3, wherein the at least one RF switch comprises a plurality of switches connected in parallel between different pairs of locations on the first bus and the second bus to controllably electrically couple and decouple the first bus from the second bus.

5. The plasma reactor of claim 1, wherein the at least one RF switch includes a first switch configured to controllably electrically couple and decouple the first bus from the RF power source, and comprising at least one second switch configured to controllably electrically couple and decouple the second bus from the RF power source.

6. The plasma reactor of claim 5, wherein the at least one RF switch comprises a first plurality of switches connected in parallel between different locations on the first bus and the RF power source, and the at least one second switch comprises a second plurality of switches connected in parallel between different locations on the second bus and the RF power source.

7. The plasma reactor of claim 6, wherein the different locations on the first bus comprise opposing ends of the first bus and the different locations on the second bus comprise opposing ends of the second bus.

8. The plasma reactor of claim 5, wherein the at least one RF switch comprises a first plurality of switches connected in parallel between different locations on the first bus and the RF power source, and the at least one second switch comprises a second plurality of switches connected in parallel between different locations on the second bus and ground.

9. The plasma reactor of claim 8, wherein the different locations on the first bus comprise opposing ends of the first bus and the different locations on the second bus comprise opposing ends of the second bus.

10. A plasma reactor comprising:
a chamber body having an interior space that provides a plasma chamber;
a gas distributor to deliver a processing gas to the plasma chamber;
a pump coupled to the plasma chamber to evacuate the chamber;
a workpiece support to hold a workpiece;
an intra-chamber electrode assembly comprising a plurality of filaments extending laterally through the plasma chamber between a ceiling of the plasma chamber and the workpiece support, each filament including a conductor surrounded by a cylindrical insulating shell, wherein the plurality of filaments includes a first multiplicity of filaments and a second multiplicity of filaments arranged in an alternating pattern with the first multiplicity of filaments,
a first bus coupled to the first multiplicity of filaments and a second bus coupled to the second multiplicity of filaments;
an RF power source to apply an RF signal the intra-chamber electrode assembly; and
at least one RF switch configured to controllably electrically couple and decouple the first bus from one of i) ground, ii) the RF power source, or iii) the second bus, wherein the at least one RF switch includes a first switch configured to controllably electrically couple and decouple the first bus from ground, and comprising at least one second RF switch configured to controllably electrically couple and decouple the second bus from ground.

11. The plasma reactor of claim 10, wherein the at least one RF switch comprises a first plurality of switches connected in parallel between different locations on the first bus and ground, and the at least one second RF switch comprises a second plurality of switches connected in parallel between different locations on the second bus and ground.

12. The plasma reactor of claim 11, wherein the different locations on the first bus comprise opposing ends of the first bus and the different locations on the second bus comprise opposing ends of the second bus.

13. A plasma reactor comprising:
a chamber body having an interior space that provides a plasma chamber;
a gas distributor to deliver a processing gas to the plasma chamber;
a pump coupled to the plasma chamber to evacuate the chamber;
a workpiece support to hold a workpiece;
an intra-chamber electrode assembly comprising a plurality of filaments extending laterally through the plasma chamber between a ceiling of the plasma chamber and the workpiece support, each filament including a conductor surrounded by a cylindrical insulating shell, wherein the plurality of filaments includes a first multiplicity of filaments and a second multiplicity of filaments arranged in an alternating pattern with the first multiplicity of filaments,
a first bus coupled to the first multiplicity of filaments, a second bus coupled to the second multiplicity of filaments, a third bus coupled to the first multiplicity of filaments, and a fourth bus coupled to the second multiplicity of filaments;
an RF power source to apply an RF signal the intra-chamber electrode assembly; and at least one RF switch configured to controllably electrically couple and decouple the first bus from one of i) ground, ii) the RF power source, or iii) the second bus;

wherein the plurality of filaments have a plurality of first ends and a plurality of second ends and a first end of each respective filament is closer to a first sidewall of the plasma chamber than a second end of the respective filament, and wherein the first bus is coupled to the first ends of the first multiplicity of filaments, the second bus is coupled to the first ends of the second multiplicity of filaments, the third bus is coupled to the second ends of the first multiplicity of filaments, and the fourth bus is coupled to the second ends of the second multiplicity of filaments.

14. The plasma reactor of claim 13, wherein the at least one RF switch is configured to controllably electrically couple and decouple the first bus from the second bus, and comprising at least one second RF switch configured to controllably electrically couple and decouple the third bus from the fourth bus.

15. The plasma reactor of claim 13, wherein the at least one RF switch includes a first switch configured to controllably electrically couple and decouple the first bus from ground, and comprising at least one second RF switch configured to controllably electrically couple and decouple the third bus from ground.

16. The plasma reactor of claim 15, wherein the RF power source is coupled by a first tap to the fourth bus and by a second tap to the second bus.

17. The plasma reactor of claim 15, comprising at least one third RF switch configured to controllably electrically couple and decouple the third bus from ground, and comprising at least one fourth RF switch configured to controllably electrically couple and decouple the fourth bus from ground.

18. The plasma reactor of claim 13, wherein the at least one RF switch includes a first switch configured to controllably electrically couple and decouple the first bus from ground, and comprising at least one second RF switch configured to controllably electrically couple and decouple the second bus from the RF source, at least one third RF switch configured to controllably electrically couple and decouple the third bus from ground, and comprising at least one fourth RF switch configured to controllably electrically couple and decouple the fourth bus from the RF source.

19. The plasma reactor of claim 13, wherein the at least one RF switch includes a first switch configured to controllably electrically couple and decouple the first bus from the RF source, and comprising at least one second RF switch configured to controllably electrically couple and decouple the second bus from the RF source, at least one third RF switch configured to controllably electrically couple and decouple the third bus from the RF source, and comprising at least one fourth RF switch configured to controllably electrically couple and decouple the fourth bus from the RF source.

20. A plasma reactor comprising:
 a chamber body having an interior space that provides a plasma chamber;
 a gas distributor to deliver a processing gas to the plasma chamber;
 a pump coupled to the plasma chamber to evacuate the chamber;
 a workpiece support to hold a workpiece;
 an intra-chamber electrode assembly comprising a plurality of filaments extending laterally through the plasma chamber between a ceiling of the plasma chamber and the workpiece support, each filament including a conductor surrounded by a cylindrical insulating shell,
 a bus outside the chamber and coupled to opposing ends of plurality of filaments;
 an RF power source to apply an RF signal the intra-chamber electrode assembly; and
 a plurality of RF switches configured to controllably electrically couple and decouple a plurality of different locations on bus from one of i) ground or ii) the RF power source.

* * * * *

UNITED STATES PATENT AND TRADEMARK OFFICE
CERTIFICATE OF CORRECTION

PATENT NO. : 10,510,515 B2
APPLICATION NO. : 16/015074
DATED : December 17, 2019
INVENTOR(S) : Kenneth S. Collins et al.

Page 1 of 1

It is certified that error appears in the above-identified patent and that said Letters Patent is hereby corrected as shown below:

In the Claims

Column 31, Line 30, in Claim 2, delete "the one of the one of" and insert -- the one of -- therefor.

Signed and Sealed this
Third Day of March, 2020

Andrei Iancu
*Director of the United States Patent and Trademark Office*